(12) United States Patent
Yamazaki et al.

(10) Patent No.: US 8,338,940 B2
(45) Date of Patent: Dec. 25, 2012

(54) SEMICONDUCTOR DEVICE

(75) Inventors: Takao Yamazaki, Tokyo (JP); Shinji Watababe, Tokyo (JP); Shizuaki Masuda, Shizuoka (JP); Katsuhiko Suzuki, Shizuoka (JP)

(73) Assignees: NEC Corporation, Tokyo (JP); NEC Accesstechnia Ltd., Shizuoka (JP)

( * ) Notice: Subject to any disclaimer, the term of this patent is extended or adjusted under 35 U.S.C. 154(b) by 112 days.

(21) Appl. No.: 12/920,265

(22) PCT Filed: Mar. 26, 2009

(86) PCT No.: PCT/JP2009/056851
§ 371 (c)(1),
(2), (4) Date: Aug. 30, 2010

(87) PCT Pub. No.: WO2009/119904
PCT Pub. Date: Oct. 1, 2009

(65) Prior Publication Data
US 2011/0031610 A1 Feb. 10, 2011

(30) Foreign Application Priority Data
Mar. 28, 2008 (JP) ................................. 2008-087138

(51) Int. Cl.
*H05K 7/02* (2006.01)
*H01L 23/48* (2006.01)

(52) U.S. Cl. ......... 257/693; 257/E23.068; 257/E21.506; 257/675; 257/737; 257/738; 257/734; 257/777; 257/778; 257/686; 257/685; 257/668; 257/712; 257/713; 257/720

(58) Field of Classification Search .................. 257/693, 257/675, E23.068, E21.506, 737, 738, 734, 257/777, 778, 686, 685, 668, 712, 713, 717, 257/720
See application file for complete search history.

(56) References Cited

U.S. PATENT DOCUMENTS

| | | | |
|---|---|---|---|
| 6,166,443 A | 12/2000 | Inaba et al. | |
| 6,678,167 B1 | 1/2004 | Degani et al. | |
| 7,230,328 B2 * | 6/2007 | Hazeyama et al. | 257/685 |
| 2007/0210400 A1 * | 9/2007 | Moribayashi et al. | 257/440 |
| 2010/0246144 A1 * | 9/2010 | Yamazaki et al. | 361/749 |

FOREIGN PATENT DOCUMENTS

JP 11-312780 A 11/1999
(Continued)

*Primary Examiner* — A O Williams
(74) *Attorney, Agent, or Firm* — Sughrue Mion, PLLC

(57) ABSTRACT

Provided is a semiconductor device including a flexible circuit board which includes a first external electrode provided on a first face and second and third external electrodes provided on a second face; a plurality of memory devices and passive components; a supporter which is provided with a groove on one face; and a computing processor device. The memory devices and the passive components are connected to the first external electrode, the one face of the supporter is bonded on the first face of the flexible circuit board so that the groove houses the memory devices and the passive components. The flexible circuit board is bent along a perimeter of the supporter to be wrapped around a side face and another face of the supporter. On the flexible circuit board, the second external electrode is provided on the second face which is opposite to the first external electrode, and the third external electrode is provided on the second face which is bent to the another face of the supporter. The computing processor device is connected to the second external electrode, and a bump is formed on the third external electrode.

26 Claims, 21 Drawing Sheets

FOREIGN PATENT DOCUMENTS

| | | |
|---|---|---|
| JP | 2001-244406 A | 9/2001 |
| JP | 2004-172322 A | 6/2004 |
| JP | 2006-190834 A | 7/2006 |
| JP | 2007-188921 A | 7/2007 |
| JP | 2007-251225 A * | 9/2007 |

* cited by examiner

SEMICONDUCTOR DEVICE

TECHNICAL FIELD

This invention relates to a semiconductor device, a method of manufacturing the semiconductor device, and a printed circuit board and an electronic device to which the semiconductor device is mounted. In particular, this invention relates to a small-sized semiconductor device in which a computing processor device is combined with a plurality of memory devices and/or a plurality of passive parts, and a manufacturing method and the like of the small-sized semiconductor device.

BACKGROUND ART

FIG. 20 illustrates a printed circuit board which uses a related technology (surface mount technology (SMT)) to mount semiconductor parts and which is referred to as a related semiconductor device I. The related semiconductor device I is characterized by its structure in which a plurality of memory packages 102 (for example, DRAM packages) and a plurality of passive parts 103 (including capacitors, resistors, and inductors) are two-dimensionally mounted in parallel around a computing processor package 101, and is used in many electronic devices.

FIG. 21 is a sectional view of a related semiconductor device II. The related semiconductor device II is characterized by its structure in which bare semiconductor chips 204 and 205 are stacked like a pyramid (bare chips are adhered to each other with the use of an adhesive film called a die attach film), respective external terminals of the bare chips are connected to external terminals of an interposer substrate 206 by wire bonding, and the entire assembly is sealed with a resin. This is a packaging technology that accomplishes a reduction in device mount area in a semiconductor device that includes a plurality of devices, and the related semiconductor device II is one of three-dimensional packaging semiconductor devices widely used in cellular phones.

FIG. 22 is a sectional view of a semiconductor device III, which is described in Japanese Unexamined Patent Application Publication (JP-A) No. 2006-190834 (Patent Document 1). The semiconductor device III is a three-dimensional packaging semiconductor device characterized in that: external terminals (pads 304) of a first semiconductor chip 301 are opposed to and connected to external terminals (pads 304) of a second semiconductor chip 302, which differs from the first semiconductor chip 301 in outer size, with bumps 303; external terminals (pads 304) of an interposer substrate (flexible circuit board 306), which has a hole 309 at its center, and external terminals (pads 304) located in the perimeter of one of the semiconductor chips that is larger in outer size (chip 301 in FIG. 22) are connected to each other with bumps 303; and the hole 309 houses the semiconductor chip that is smaller in outside size (chip 302 in FIG. 22).

FIG. 23 is a sectional view of a semiconductor device IV, which is described in Japanese Unexamined Patent Application Publication (JP-A) No. 2007-188921 (Patent Document 2). The semiconductor device IV is a three-dimensional packaging semiconductor device characterized in that: a rigid wiring board 402 and a flexible wiring board 403 are combined to create an interposer substrate; a semiconductor element (LSI 401) is mounted to each side of the interposer substrate in a portion where the rigid wiring board 402 is located; and the flexible wiring board 403 is bent to be fixed to the rear side of one of the LSIs 401 (opposite face side from the external terminal face side).

DISCLOSURE OF THE INVENTION

Problem to be Solved by the Invention

The semiconductor device I of FIG. 20 has a structure in which a plurality of DRAM packages 102 and a plurality of passive parts 103 (including resistors, capacitors, and inductors) are two-dimensionally mounted in parallel around the computing processor package 101 (structure using surface mount technology (SMT)). This structure has a problem in that the total mount area of the computing processor and the plurality of DRAMs is large enough to make it difficult to reduce the size of an electronic device to which the semiconductor device I is applied. Another problem of the structure of FIG. 20, where the wiring distance from the computing processor to the DRAMs is long, is that, when the computing processor and the DRAMs have high operating clock frequencies (for example, 100 MHz or higher), the long wiring distance causes a noticeable signal delay, a large signal loss, and malfunction. In the case where bare chips are used for a plurality of devices in order to reduce the outer size of a semiconductor device and shorten the wiring distance between the devices, a new problem arises in that the impossibility or extreme difficulty of obtaining a known good die (KGD) bare semiconductor chip lowers the assembly yield of the semiconductor device and increases the manufacture cost.

When the structure of the stacked-chip semiconductor device II of FIG. 21 is used in manufacturing a semiconductor device in which a computing processor (bare chip) 204 and a memory (bare chip) 205 are packaged three-dimensionally, the bare chips are in contact with each other through a thin adhesive layer 207. For example, in the case where the computing processor is a three-dimensional image processing processor and the memory is a DRAM, the amount of heat generated by the three-dimensional image processing processor is generally as large as 5 W or more, and the heat generated by the processor is transmitted directly to the DRAMs, thereby heating the DRAMs to a temperature above their operation guarantee temperature (generally 70° C. to 80° C.) and causing a problem in that the semiconductor device fails to operate.

The semiconductor device III described in Patent Document 1 and illustrated in FIG. 22 has a structure in which external terminals (pads 304) of semiconductor chips (301 and 302 in FIG. 22) having different outer sizes are opposed to and connected to each other with bumps 303, the external terminals (bumps 303) of one of the semiconductor chips that is larger in outer size (chip 301 in FIG. 22) are connected to external terminals (bumps 303) of an interposer substrate (flexible circuit board 306) having a hole 309 at its center, and the hole 309 at the center of the interposer substrate 309 houses the semiconductor chip that is smaller in outer size (chip 302 in FIG. 22). A problem is that, to implement this structure, external terminals of a plurality of semiconductor chips need to have layouts designed exclusively in relation to one another in advance, which lowers the degree of freedom in designing a semiconductor device. Other problems that arise from the need to design semiconductor chips exclusively for this structure include long-term development accompanied by high manufacture cost and the inflexibility in suiting the memory capacity to the needs of a customer. Another drawback of this structure is the difficulty in mounting a plurality of passive parts including resistors, capacitors, and inductors near the semiconductor chips (particularly the memory chip), which makes it difficult for a semiconductor device with a combination of a high-speed computing processor and a high-speed DRAM, or other types of high-speed memory, to operate.

The semiconductor device IV described in Patent Document 2 and illustrated in FIG. 23 has a structure in which a rigid wiring board 402 and a flexible wiring board 403 are combined to create an interposer substrate, a semiconductor element (LSI 401) is mounted to each side of the interposer substrate in a portion where the rigid wiring board 402 is located, and the flexible wiring board 403 is bent to be fixed to the rear side of one of the LSIs 401 (opposite face side from the external terminal face side). The foremost problem is the high manufacture cost of the interposer substrate created by combining the rigid wiring board 402 and the flexible wiring board 403. Another problem is that, when a device mounted to the interposer substrate has large outside dimensions or when a plurality of devices is to be mounted, the resultant increase in interposer substrate area causes the substrate to warp significantly, thereby inviting defective packaging. This could be remedied by thickening the interposer substrate, but the solution in turn causes a new problem in that the thickness of the semiconductor device is increased.

In a case related to the above-mentioned technologies where, irrespective of whether a memory device is used or not, a high-speed computing processor device that operates at, for example, a clock frequency higher than several hundreds MHz is used in a circuit board or an electronic device, a DC voltage V supplied to the device instantly drops (fluctuation $\Delta V$), for example, in a manner illustrated in FIG. 24, and causes malfunction upon high-speed switching (power on/off) of the computing processor device, due to a parasitic inductance (L) observed in wiring that runs from a DC power supply 505 to the device and in via and through holes of the printed circuit board.

FIG. 24 illustrates the fluctuation ($\Delta V$) of the DC voltage (V) supplied to a computing processor device 504, in a case where the computing processor device 504 performing high-speed switching at a rise time of t1 is mounted to a printed circuit board 507. In FIG. 24, a decoupling capacitor for reducing or compensating the fluctuation ($\Delta V$) of the DC voltage V is not mounted to the printed circuit board 507. An equivalent circuit of FIG. 24 is illustrated in FIG. 25. When the computing processor device 504 switches on and off at high speed, the DC voltage V supplied to the computing processor device 504 fluctuates (by $\Delta V$) due to the parasitic inductance L (=L1+L2+L3+L4+L5+L6) observed in wiring that runs between a DC source and the computing processor device 504, or in via and through holes 506 of the printed circuit board 507. The DC voltage fluctuation amount ($\Delta V$) is expressed by Expression (1) in which L has a minus sign because an electromotive force is induced in a manner that cancels out an instantly generated current i.

$$\Delta V = -L \times di/dt \tag{1}$$

The voltage fluctuation amount $\Delta V$ therefore increases as the parasitic inductance observed in wiring lines 501, 502, and 503 and in via and through holes 506 become larger and the rate of current fluctuation with time (di/dt) becomes larger. An increase in clock frequency shortens the rise time t1 and accordingly makes the voltage fluctuation amount $\Delta V$ larger than Expression (1). In addition, an effort to reduce the power consumption of the computing processor device 504 by lowering the input voltage V (for example, from 3.3 V to 1.8V) has been made in recent years, with the result that the rate of voltage fluctuation ($\Delta V/V$) is becoming increasingly larger, exceeding the operation specification tolerance value (in general, approximately 5%) of the computing processor device. No problem arises if this voltage fluctuation may be compensated by a switching power supply. However, voltage fluctuation compensation by a switching power supply takes 100 ns to several tens µs and may not keep up with a voltage fluctuation of a device that switches at high speed (several hundreds ps to 1 ns).

In order to avoid malfunction due to this voltage fluctuation, decoupling capacitors 607 are connected in parallel between a power supply line and a ground line of a computing processor device 604 as illustrated in FIG. 26. The decoupling capacitors 607 have two effects. An effect 1 is that a high-speed switching signal generated by the computing processor device 604 is bypassed to cut short the path of the high-speed signal and to thereby reduce the parasitic inductance L (as a result, $\Delta V = -L \times di/dt$ is reduced), and an effect 2 is that the temporary voltage drop upon high-speed switching is compensated by supplying electric charges (discharging) from the decoupling capacitors 607. Expression (1) shows that $\Delta V$ is reduced by minimizing the inductance L observed in the high-speed signal path (such as L observed in wiring and in via and through holes). A common way to minimize the inductance L is to mount the decoupling capacitors 607 right beside the computing processor device 604 and immediately below the computing processor device 604 with a printed circuit board 608 interposed therebetween as illustrated in FIG. 26. As a result, the fluctuation $\Delta V$ of a DC voltage supplied to the computing processor device 604 is reduced owing to the effect 1 and effect 2 of the decoupling capacitors 607.

FIG. 27 illustrates an equivalent circuit of FIG. 26. The effect 1 and effect 2 of the decoupling capacitors (abbreviated as DCC in FIG. 27) bring the fluctuation $\Delta V$ of the DC voltage supplied to the computing processor device down in a manner indicated by the dotted line in an upper right graph of FIG. 27. However, reducing the DC voltage fluctuation with the use of decoupling capacitors has a problem in that the number of decoupling capacitors required is generally large, which means a large mount area and an increase in printed circuit board area accompanied by an increase in cost. Another problem is that, when the wiring distance from the decoupling capacitors to the computing processor is long, the parasitic inductance observed in the wiring paths is too large to prevent the instantaneous voltage drop and thus hinders steady operation of the semiconductor device. In other words, the chance of the semiconductor device operating steadily is higher when the wiring distance from the decoupling capacitors to the computing processor is shorter.

This invention has been made in view of those problems, and an exemplary object of this invention is therefore to provide a three-dimensional packaging semiconductor device which is small-sized and thin despite being built from a combination of many devices including a computing processor device, a plurality of memory devices, and a plurality of passive parts, which has no trouble operating when a high-speed processor and a high-speed memory are used, which has excellent heat dissipation characteristics, which is free in the selection of a processor without needing to take the power consumption of the processor into consideration, which has a high assembly yield, and which is high in packaging reliability and low in cost, and to provide a method of manufacturing the three-dimensional packaging semiconductor device.

Another exemplary object of this invention is to provide a printed board circuit and an electronic device which are reduced in outside area and volume and, as a result, reduced in cost even more by having the three-dimensional packaging semiconductor device mounted thereto.

Means to Solve the Problem (1) In order to attain the above-mentioned exemplary objects, a first aspect of the present invention provides a semiconductor device including: one flexible circuit board which includes a first external electrode provided on a first face, a second external electrode and a third external electrode provided on a second face, and at least two wiring layers; a plurality of memory devices; a plurality of passive parts which include at least one type out of resistor, capacitor, and inductor; a supporter which is provided with at least one groove for housing the plurality of memory devices and the plurality of passive parts; and one computing processor device, in which the one flexible circuit board is larger in area than the supporter, the plurality of memory devices and the plurality of passive parts are mounted flatly to the first face of the one flexible circuit board and electrically connected to the first external electrode on the first face, and the plurality of passive parts are mounted in a vicinity of the plurality of memory devices, in which the supporter is adhered to the first face of the one flexible circuit board, or electrically connected to the first external electrode provided on the first face, so as to enclose the plurality of memory devices and the plurality of passive parts, and the plurality of memory devices and the plurality of passive parts are housed inside the at least one groove of the supporter, in which the one flexible circuit board is bent along a perimeter of the supporter to be wrapped around at least one side face of the supporter and at least a portion of a face of the supporter that is opposite to a face where the at least one groove is formed, and the one flexible circuit board is adhered to at least the portion of the face of the supporter, in which the second external electrode of the one flexible circuit board is provided on the second face, which is opposite to the first external electrode on which the plurality of memory devices and the plurality of passive parts are mounted, the one computing processor device is electrically connected to the second external electrode, and an external terminal face of the one computing processor device faces external terminal faces of the plurality of memory devices as well as the plurality of passive parts with the one flexible circuit board interposed therebetween, in which the face of the supporter which is opposite to the face where the at least one groove is formed has the third external electrode of the one flexible circuit board, and a solder bump is formed on the third external electrode, and in which, when the solder bump is defined as a bottom face, the one computing processor device is mounted on a topmost face.

According to the first aspect of the present invention, a semiconductor device has a three-dimensional packaging structure in which a plurality of memory devices and a plurality of passive parts are mounted flatly and connected electrically to one of faces of a flexible circuit board, a computing processor device is electrically connected to a face opposite to the face where the plurality of memory devices and the plurality of passive parts are mounted, and an external terminal face of the processor device faces external terminal faces of the plurality of memory devices as well as the plurality of passive parts with the flexible circuit board interposed therebetween. The semiconductor device is therefore small in size despite including a plurality of devices, and is also thin because the plurality of memory devices and the plurality of passive parts are mounted flatly to the same side of the flexible circuit board. In addition, the wiring distance from the computing processor device to the plurality of memory devices may be cut short, which means that a signal delay and a signal loss may be reduced even when the operating frequency of a device used is high (for example, approximately 100 MHz or higher). The semiconductor device may thus operate steadily.

In addition, according to the first aspect of the present invention, because the computing processor device is on the topmost face of the semiconductor device, heat is readily dissipated even when the power consumption of the computing processor device is large. As a result, heat generated by the computing processor device is prevented from raising the temperature of its adjacent memory devices, and maintaining the ambient temperature equal to or lower than the operation guarantee temperature of the memory devices is facilitated. In addition, according to the first aspect of the present invention, because the plurality of passive parts (capacitors, resistors, and the like) are mounted in the vicinity of the computing processor device and the memory devices, switching noise in high-speed signal propagation and various other types of noise may be effectively reduced even when the operating frequency of a device used is as high as 100 MHz or more, for example. The semiconductor device may thus operate steadily. According to the first aspect of the present invention, a supporter with a groove encloses the plurality of memory devices and the plurality of passive parts, the flexible circuit board is wrapped around the supporter, and external electrodes of the semiconductor device are provided on a face (a level face) of the supporter, which is opposite to a face where the groove is formed. Therefore, the obtained semiconductor device is also high in levelness and packaging yield.

(2) A semiconductor device of the present invention is structured so that, in the semiconductor device according to the first aspect, the one computing processor device is larger in area than the plurality of memory devices and the plurality of passive parts combined.

In the semiconductor device according to the first aspect of this invention, where the computing processor device is mounted to the topmost face, the overall outer size of the semiconductor device may be minimized by designing the semiconductor device such that the combined area of the plurality of memory devices and the plurality of passive parts is smaller than the area of the computing processor device, which is the core of the semiconductor device of this invention (the computing processor device is defined as the core because the device specifications of the computing processor device are determined at the very beginning of designing the semiconductor device).

(3) In order to attain the above-mentioned exemplary objects, a second aspect of the present invention provides a semiconductor device including: one flexible circuit board which includes a first external electrode provided on a first face, a second external electrode and a third external electrode provided on a second face, and at least two wiring layers; a plurality of passive parts which include at least one type out of resistor, capacitor, and inductor; a supporter which is provided with at least one groove for housing the plurality of passive parts; and one computing processor device, in which the one flexible circuit board is larger in area than the supporter, the plurality of passive parts are mounted flatly to the first face of the one flexible circuit board and electrically connected to the first external electrode on the first face, in which the supporter is adhered to the first face of the one flexible circuit board, or electrically connected to the first external electrode provided on the first face, so as to enclose the plurality of passive parts, and the plurality of passive parts are housed inside the at least one groove of the supporter, in which the one flexible circuit board is bent along a perimeter of the supporter to be wrapped around at least one side face of the supporter and at least a portion of a face of the supporter that is opposite to a face where the at least one groove is formed, and the one flexible circuit board is adhered to at least the portion of the face of the supporter, in which the second external electrode of the one flexible circuit board is provided on the second face, which is opposite to the first external electrode on which the plurality of passive parts are mounted, the one computing processor device is electrically connected to the second external electrode, and an external terminal face of the one computing processor device faces external terminal faces the plurality of passive parts with the one flexible circuit board interposed therebetween, in which the face of the supporter which is opposite to the face where the at least one groove is formed has the third external electrode of the one flexible circuit board, and a solder bump is formed on the third external electrode, and in which, when the solder bump is defined as a bottom face, the one computing processor device is mounted on a topmost face.

According to the second aspect of the present invention, a plurality of components, in most cases, decoupling capacitors (also called bypass capacitors) which has conventionally been mounted right beside the computing processor device, or mounted to a face opposite from the computing processor device with a printed circuit board interposed therebetween, may be taken inside the semiconductor device. The printed circuit board may thus be reduced in size. Further, in particular, this invention uses a flexible circuit board that has two or more wiring layers as an interposer. Because flexible circuit boards usually have a thickness of approximately 0.09 mm to 0.15 mm and are thinner than conventional rigid circuit boards (thickness: approximately 0.8 mm to 1.0 mm), a parasitic inductance observed in wiring or via and through holes within the board may be reduced as well, which gives this invention another feature in that the noise of high-frequency signals may be reduced even more.

In addition, the decoupling capacitors may be placed in a space between the printed circuit board (motherboard) and the computing processor device, which is near to a power supply terminal and ground terminal of the computing processor device. This makes a parasitic inductance observed between the computing processor device and the decoupling capacitors smaller than in conventional packaging modes, and reduces a voltage fluctuation generated upon switching of the computing processor device. The obtained semiconductor device may therefore operate steadily.

(4) In order to attain the above-mentioned exemplary objects, a third aspect of the present invention provides a semiconductor device including: one flexible circuit board which includes a first external electrode provided on a first face, a second external electrode and a third external electrode provided on a second face, and at least two wiring layers; a plurality of memory devices; a supporter which is provided with at least one groove for housing the plurality of memory devices; and one computing processor device, in which the one flexible circuit board is larger in area than the supporter, the plurality of memory devices are mounted flatly to the first face of the one flexible circuit board and electrically connected to the first external electrode on the first face, in which the supporter is adhered to the first face of the one flexible circuit board, or electrically connected to the first external electrode provided on the first face, so as to enclose the plurality of memory devices, and the plurality of memory devices are housed inside the at least one groove of the supporter, in which the one flexible circuit board is bent along a perimeter of the supporter to be wrapped around at least one side face of the supporter and at least a portion of a face of the supporter that is opposite to a face where the at least one groove is formed, and the one flexible circuit board is adhered to at least the portion of the face of the supporter, in which the second external electrode of the one flexible circuit board is provided on the second face, which is opposite to the first external electrode on which the plurality of memory devices are mounted, the one computing processor device is electrically connected to the second external electrode, and an external terminal face of the one computing processor device faces external terminal faces of the plurality of memory devices with the one flexible circuit board interposed therebetween, in which the face of the supporter which is opposite to the face where the at least one groove is formed has the third external electrode of the one flexible circuit board, and a solder bump is formed on the third external electrode, and in which, when the solder bump is defined as a bottom face, the one computing processor device is mounted on a topmost face.

This structure is similar to the semiconductor device according to the first aspect but differs in that plurality of passive parts is not mounted inside the semiconductor device. The structure according to the third aspect may be applied to, for example, a case where the semiconductor device is for mobile device uses and may operate on its own without including passive parts inside because, for example, the computing processor device and the plurality of memory devices have an operating frequency of approximately 100 MHz or lower. An advantage of a semiconductor device that does not include the plurality of passive parts inside is that the semiconductor is reduced in size that much. The structure according to the third aspect is preferable also for a case where a user wishes for his/her own reasons to mount passive parts later around the semiconductor device on a motherboard.

(5) A semiconductor device of the present invention is structured so that, in each of the semiconductor devices according to the first to third aspects, the one computing processor device includes at least one of a heat spreader and a heat sink.

According to the present invention, the cooling effect of the semiconductor device is enhanced and the temperature of the semiconductor device may be prevented from rising even more effectively. The semiconductor device may thus operate steadily.

(6) A semiconductor device of the present invention is structured so that, in each of the semiconductor devices according to the first to third aspects, the one computing processor device and the plurality of memory devices, or the one computing processor device alone, is a ball grid array (BGA)-type package.

According to present invention, a plurality of memory devices and one computing processor device, or one computing processor device, is a BGA-type package guaranteed of quality, instead of a bare chip. A semiconductor device that has a high assembly yield may thus be obtained. There are various other quality-guaranteed packages than BGA-type packages, including the thin small outline package (TSOP) type, the small outline package (SOP) type, the quad flat package (GFP) type, and the tape carrier package (TCP) type. Among those, BGA-type packages are particularly small in size and using a BGA-type package reduces the size of the semiconductor device even more. While BGA-type packages are classified into, for example, μ (micro)-BGA, Fine pitch BGA (FBGA), and wafer-level CSP, the term "BGA-type package" here refers to any of those and other BGA packages that have solder balls (or solder bumps) as external terminals.

(7) A semiconductor device of the present invention is structured so that, in each of the semiconductor devices according to the first to third aspects (excluding the invention of Item (3)), the plurality of memory devices are dynamic random access memories (DRAMs) and the one computing processor device is an image processing processor.

According to present invention, a plurality of DRAMs is used as memory devices and an image processing processor is used as the computing processor device, which makes high-speed processing of large-capacity information possible. A small-sized image processing module capable of displaying high-definition images and three-dimensional motion pictures on a screen may thus be realized.

(8) A semiconductor device of the present invention is structured so that, in each of the semiconductor devices according to the first to third aspects (excluding the invention of Item (3)), at least one of the plurality of memory devices has a multi-chip package structure, or has a package-on-package structure in which packages are stacked on top of one another.

According to the present invention, at least one of the memory devices has a multi-chip package structure, or a package-on-package structure in which packages are stacked on top of one another, and more memory devices may be mounted when the areal dimensions are the same. The semiconductor device may thus have a large capacity memory.

(9) A semiconductor device of the present invention is structured so that, in each of the semiconductor devices according to the first to third aspects, the supporter is made of a metal material and electrically connected to a ground of the one flexible circuit board.

According to the present invention, the supporter is made of a metal material and is connected to the ground of the flexible circuit board. Therefore, despite the supporter being made of a metal material, the electric potential of the supporter is stable and a ground for the entire semiconductor device is strengthened, which means that the semiconductor device may have a ground with no or few electric potential fluctuations and may operate steadily.

(10) A semiconductor device of the present invention is structured so that, in each of the semiconductor devices according to the first to third aspects, the supporter is at least partially made of a material selected from the group consisting of an alloy containing Ni such as alloy 42 or Kovar, ceramics, and Si.

According to the present invention, the supporter is at least partially made of a material selected from the group consisting of an alloy containing Ni such as alloy 42 or Kovar, ceramics, and Si. Those materials have as small a linear expansion coefficient as 3 ppm to 5 ppm and are accordingly helpful in preventing the flexible circuit board which is placed over the groove of the supporter from warping and from developing surface irregularities, thereby preventing defective packaging of the computing processor device which is mounted to the flexible circuit board over the groove. As a result, a semiconductor device with a high assembly yield may be realized.

(11) A semiconductor device of the present invention is structured so that, in each of the semiconductor devices according to the first to third aspects, the supporter is created from at least one plate, which has at least one through hole for housing the plurality of memory devices and the plurality of passive parts, and from one flat plate by stacking the at least one plate and the one flat plate.

According to the present invention, the supporter with a groove is created by stacking at least one plate which has at least one through hole for housing the plurality of memory devices and the plurality of passive parts and one flat plate. The supporter may therefore be manufactured at a lower cost than when the groove is formed in a single flat plate material by etching or with the use of a mold. In addition, the supporter may be created from a combination of different materials, and may therefore meet such requirements as being low in linear expansion coefficient, being light-weight, and being inexpensive, more easily than when the supporter is created from a single material.

(12) A semiconductor device of the present invention is structured so that, in the semiconductor device according to the invention of Item (11), at least a portion of the at least one plate of the supporter where the at least one through hole is opened is made of an alloy containing Ni such as alloy 42 or Kovar.

According to the present invention, at least the plate which is adhered to or connected to the flexible circuit board and which has the through hole opened therein is made of a material selected from the group consisting of an alloy containing Ni such as alloy 42 or Kovar, ceramics, and Si. Those materials have as small a linear expansion coefficient as 3 ppm to 5 ppm and are accordingly helpful in preventing the flexible circuit board which is placed over the groove of the supporter from warping and from developing surface irregularities, thereby avoiding defective packaging of the computing processor device which is mounted to the flexible circuit board over the groove. As a result, a semiconductor device with a high assembly yield is realized. In addition, because at least the plate which is adhered to or connected to the flexible circuit board and which has the through hole opened therein is made of a material selected from the group consisting of an alloy containing Ni such as alloy 42 or Kovar, ceramics, and Si, connecting the plate to a ground of the flexible circuit board strengthens the ground. As a result, the semiconductor device may have a ground with no or few electric potential fluctuations and may operate steadily.

(13) A semiconductor device of the present invention is structured so that, in the semiconductor device according to the invention of Item (11), of components of the supporter, at least the one flat plate is made of a material selected from the group consisting of aluminum, an aluminum alloy, titanium, a titanium alloy, ceramics, and Si.

According to the present invention, of the components of the supporter, at least the one flat plate is made of a material selected from the group consisting of aluminum, an aluminum alloy, titanium, a titanium alloy, ceramics, and Si. Those materials are small in specific gravity and accordingly may make the supporter light-weight. When the supporter is heavy-weighted, solder balls serving as external terminals are crushed significantly by the semiconductor device's own weight in secondary packaging where the semiconductor device is mounted to a printed board, which increases the risk of short circuit between adjacent solder balls and lowers the packaging yield. However, with this structure, the short circuit defect may be remedied and a semiconductor device that has a high assembly yield may be realized.

(14) A semiconductor device of the present invention is structured so that, in each of the semiconductor devices according to the inventions of Items (11) to (13), stacked components of the supporter are, at least partially, adhered to or connected to each other through a conductive material or an insulative material, or at least partially welded to each other.

According to the present invention, the plate with a through hole and the flat plate which are components of the supporter are at least partially connected or adhered to each other through a conductive or insulating material, or at least partially welded to each other. Therefore, in the step of bending and adhering the flexible circuit board to wrap the flexible circuit board around the supporter, the supporter may maintain a stable shape (meaning that the supporter does not break apart in the step of adhering the flexible circuit board) and, as a result, a semiconductor device high in assembly yield may be realized.

(15) A semiconductor device of the present invention is structured so that, in each of the semiconductor devices according to the inventions of Items (11) to (13), a surface of one of stacked components of the supporter includes a projection formed thereon, another component which is stacked together with the one component includes a through hole or a groove formed therein to receive the projection, and the stacked components are connected to each other at the projection and the through hole or the groove.

According to the present invention, a projection is formed on a surface of one of the stacked components of the supporter, a through hole, or a groove, to receive the projection is formed in the other component which is stacked together with the one component, and the stacked components are connected to each other at the projection and the through hole or the groove. The supporter may thus have a stable shape as in Item (14) and, in addition, because an adhesive material and a welding process are not used, may be manufactured at a cost lower than that of the supporter in the semiconductor device of Item (14).

(16) A semiconductor device of the present invention is structured so that, in each of the semiconductor devices according to the first to third aspects, the supporter includes a plurality of through holes formed in at least one of around the at least one groove of the supporter, around a through hole of a plate which is a component of the supporter, and within one flat plate which is another component of the supporter.

According to the present invention, the substantial volume of components of the supporter is reduced by opening a plurality of through holes in at least one of three places: around the groove of the supporter; around the through hole in the plate which is one of the components of the supporter; and within the one flat plate which is one of the component of the supporter. As a result, an increase of the crushing of solder balls serving as external terminals by the semiconductor device's own weight may be suppressed in secondary packaging where the semiconductor device is mounted to a printed board. The problem of short circuit defect due to short circuit between adjacent solder balls may thus be remedied and a semiconductor device that has a high assembly yield may be realized.

(17) A semiconductor device of the present invention is structured so that, in each of the semiconductor devices according to the first to third aspects, the plurality of memory devices and the supporter are in contact with each other through a heat conducting material.

According to the present invention, the semiconductor device may operate steadily even when the power consumption of the memory devices increases because heat generated by the memory devices is dissipated to the supporter through the heat conducting material (the supporter acts as a heat sink for the semiconductor device).

(18) A semiconductor device of the present invention is structured to include, in each of the semiconductor devices according to the first to third aspects, a thermoplastic adhesive resin film or an uncured thermally curable adhesive resin film attached to a portion of the first face of the one flexible circuit board, to be adhered to a surface of the supporter.

According to the present invention, a thermoplastic adhesive resin film or an uncured thermally curable adhesive resin film is attached to a region that is a portion of the first face of the flexible circuit board and is to be adhered to a surface of the supporter. The flexible circuit board bent while heated may thus be readily adhered to the surface of the supporter, and a semiconductor device that has a high assembly yield may be realized. In addition, using a film-form material as the adhesive material may give the adhesive layer a substantially uniform thickness, and reduce surface irregularities of the flexible circuit board adhered to the surface of the supporter. The obtained semiconductor device therefore has excellent levelness and may exhibit a high packaging and assembly yield in secondary packaging where the semiconductor device is mounted to a printed board.

Using a thermoplastic adhesive resin film as the adhesive layer significantly reduces the degree of elasticity of those materials (about several MPa to several tens MPa) and softens the components when the flexible circuit board is heated. The flexible circuit board may therefore readily be bent despite an increase in thickness of the flexible circuit board which is caused by the addition of the adhesive layer, and may be easily adhered to the supporter. In the case where an uncured (B-stage) thermally curable adhesive resin film is used as the adhesive layer, because this material has a small degree of elasticity (generally 100 MPa or lower) as thermoplastic resin does, the flexible circuit board may readily be bent despite an increase in thickness of the flexible circuit board which is caused by the addition of the adhesive layer, and may be easily adhered to the supporter.

(19) A semiconductor of the present invention is structured to include, in each of the semiconductor devices according to the first to third aspects, a heat sink attached to the one computing processor device, the heat sing being shaped to cover the entire semiconductor module.

According to the present invention, a heat sink is attached to the computing processor device placed on the side of the topmost face of the semiconductor device, and is shaped to cover the entire semiconductor module. The heat sink may thus have a larger overall surface area and accordingly give the obtained semiconductor device an excellent heat dissipation ability.

(20) A semiconductor device of the present invention is structured so that, in each of the semiconductor devices according to the first to third aspects, a region of the one flexible circuit board that is bent along the supporter is smaller in number of wiring layers than in other regions which are not bent.

Generally speaking, an increase in number of wiring layers which means an increased wiring material (commonly a metal material) volume in the flexible circuit board makes the step of bending and adhering the flexible circuit board to a surface of the supporter difficult (an increase in number of wiring layers of the flexible circuit board increases a repulsive force which acts to put the bent flexible circuit board back to its original shape, and therefore makes it difficult to adhere and fix the flexible circuit board to a surface of the supporter).

According to the present invention, the region of the flexible circuit board that is bent along the supporter is smaller in number of wiring layers than other regions of the flexible circuit board which are not bent. The flexible circuit board is thus bent easily despite the flexible circuit board being a multi-layer wiring board, and a semiconductor device that has a high assembly yield may be realized.

(21) In order to attain the above-mentioned exemplary objects, a printed circuit board includes the semiconductor device of any one of Items (1) to (20) according to the first to third aspects mounted thereto.

According to the present invention, one of the semiconductor devices of this invention is mounted to the printed circuit board. The printed circuit board may therefore be reduced in outer size than conventional surface mount-type printed circuit boards.

(22) In order to attain the above-mentioned exemplary objects, an electronic device includes the semiconductor device of any one of Items (1) to (20) according to the first to third aspects mounted thereto.

(23) In order to attain the above-mentioned exemplary objects, an electronic device includes the printed circuit board according to Item (21) mounted thereto.

According to the electronic devices of Items (22) and (23), one of the semiconductor devices of this invention or one of the printed circuit boards of this invention is mounted to the electronic devices, and hence the electronic devices may be reduced in size than electronic devices to which a conventional semiconductor device or a conventional printed board is mounted.

(24) In order to attain the above-mentioned exemplary objects, the first aspect of the present invention provides a method of manufacturing a semiconductor device, including: a step (a) of mounting a plurality of passive parts to a first face of a flexible circuit board; a step (b) of mounting a plurality of memory devices to the first face of the flexible circuit board; a step (c) of mounting a supporter, which includes a groove for housing the plurality of memory devices and the plurality of passive parts, to the first face of the flexible circuit board so as to enclose the plurality of memory devices and the plurality of passive parts which have been mounted to the first face of the flexible circuit board; a step (d) of bending the flexible circuit board along a perimeter of the supporter to be wrapped around at least one side face of the supporter and at least a portion of a face of the supporter that is opposite to a face where the groove is formed, and adhering the flexible circuit board to at least the portion of the face of the supporter; a step (e) of mounting a computing processor device on a second external electrode of the flexible circuit board, which is formed on a second face which is opposite to a first external electrode of the flexible circuit board, on which the plurality of memory devices and the plurality of passive parts are mounted; and a step (f) of forming a solder bump on a third external electrode of the flexible circuit board which is adhered to the face of the supporter that is opposite to the face where the groove is formed. The following manufacturing methods of this invention are methods of manufacturing the semiconductor devices according to the first to third aspects, respectively, and therefore are described in words and phrases that have been used to describe the semiconductor devices according to the first, second, and third aspects.

According to the present invention, a three-dimensional packaging semiconductor device in which a computing processor device is combined with a plurality of memory devices and a plurality of passive parts may be manufactured easily.

(25) A method of manufacturing a semiconductor device of the present invention is configured so that, in the method of manufacturing a semiconductor device according to the first aspect, at least one combination of steps is selected out of a combination of the steps (a) and (b), a combination of the steps (a), (b), and (c), and a combination of the steps (e) and (f), and the steps in the selected combination are executed simultaneously.

According to the present invention, the number of manufacturing steps may be smaller than in the semiconductor device manufacturing process of Item (24), and the manufacture cost may accordingly be lowered. In addition, because the number of reflow steps may be reduced, the thermal history of the memory devices, the passive parts, and the computing processor device may be minimized, with the result that a semiconductor device that has a high assembly yield may be obtained.

(26) In order to attain the above-mentioned exemplary objects, the second aspect of the present invention provides a method of manufacturing a semiconductor device, including: a step (a) of mounting a plurality of passive parts to a first face of a flexible circuit board; a step (b) of mounting a supporter, which includes a groove for housing the plurality of passive parts, to the first face of the flexible circuit board so as to enclose the plurality of passive parts which have been mounted to the first face of the flexible circuit board; a step (c) of bending the flexible circuit board along a perimeter of the supporter to be wrapped around at least one side face of the supporter and at least a portion of a face of the supporter that is opposite to a face where the groove is formed, and adhering the flexible circuit board to at least the portion of the face of the supporter; a step (d) of mounting a computing processor device on a second external electrode of the flexible circuit board, which is formed on a second face which is opposite to a first external electrode of the flexible circuit board, on which the plurality of passive parts are mounted; and a step (e) of forming a solder bump on a third external electrode of the flexible circuit board which is adhered to the face of the supporter that is opposite to the face where the groove is formed.

According to the second aspect of the present invention, a three-dimensional packaging semiconductor device in which a computing processor device is combined with a plurality of passive parts may be manufactured easily.

(27) A method of manufacturing a semiconductor device of the present invention is configured so that, in the method of manufacturing a semiconductor device according to the second aspect, at least one combination of steps is selected out of a combination of the steps (a) and (b) and a combination of the steps (d) and (e), and the steps in the selected combination are executed simultaneously.

According to the present invention, the number of manufacturing steps may be smaller than in the semiconductor device manufacturing method of Item (26), and the manufacture cost may accordingly be lowered. In addition, because the number of times reflow is performed may be reduced, the thermal history of the passive parts and the computing processor device may be minimized, with the result that a three-dimensional packaging semiconductor device that has a high assembly yield may be obtained.

(28) In order to attain the above-mentioned exemplary objects, a third aspect of the present invention provides a method of manufacturing a semiconductor device, including: a step (a) of mounting a plurality of memory devices to a first face of a flexible circuit board; a step (b) of mounting a supporter, which includes a groove for housing the plurality of memory devices, to the first face of the flexible circuit board so as to enclose the plurality of memory devices which have been mounted to the first face of the flexible circuit board; a step (c) of bending the flexible circuit board along a perimeter of the supporter to be wrapped around at least one side face of the supporter and at least a portion of a face of the supporter that is opposite to a face where the groove is formed, and adhering the flexible circuit board to at least the portion of the face of the supporter; a step (d) of mounting a computing processor device on a second external electrode of the flexible circuit board, which is formed on a second face which is opposite to a first external electrode of the flexible circuit board, on which the plurality of memory devices are mounted; and a step (e) of forming a solder bump on a third external electrode of the flexible circuit board which is adhered to the face of the supporter that is opposite to the face where the groove is formed.

According to the third aspect of the present invention, a three-dimensional packaging semiconductor device in which a computing processor device is combined with a plurality of memory devices may be manufactured easily.

(29) A method of manufacturing a semiconductor device of the present invention is configured so that, in the method of manufacturing a semiconductor device according to the third aspect, at least one combination of steps is selected out of a combination of the steps (a) and (b) and a combination of the steps (d) and (e), and the steps in the selected combination are executed simultaneously.

According to the present invention, the number of manufacturing steps may be smaller than in the semiconductor device manufacturing method of Item (28), and the manufacture cost may accordingly be lowered. In addition, because the number of times reflow is performed may be reduced, the thermal history of the computing processor device may be minimized, with the result that a semiconductor device that has a high assembly yield may be obtained.

Effect of the Invention

As has been described, this invention has an exemplary effect in that a three-dimensional packaging semiconductor device may be provided which is small-sized and thin despite being built from a combination of many devices including a computing processor device, a plurality of memory devices, and a plurality of passive parts, which has no trouble operating when a high-speed processor and a high-speed memory are used, which is more high-performance owing to a plurality of memories used, which has excellent heat dissipation characteristics, which is free in selection of a processor without needing to take the power consumption of the processor into consideration, which has a high assembly yield, and which is high in packaging reliability and low in cost.

Another exemplary effect is that, when a small-sized semiconductor device of this invention is mounted to a printed circuit board, the printed circuit board may be reduced in outer area and, because of the reduction in outer area, may be lowered in cost.

Still another exemplary effect is that, when a small-sized semiconductor device of this invention or a small-sized printed circuit board of this invention is mounted to an electronic device, typically, an amusement machine, a home-use game machine, medical equipment, a personal computer, an automotive navigation system, or an electronic module for automobiles, the electronic device may be reduced in size and weight and enhanced in performance.

Figure 1A:
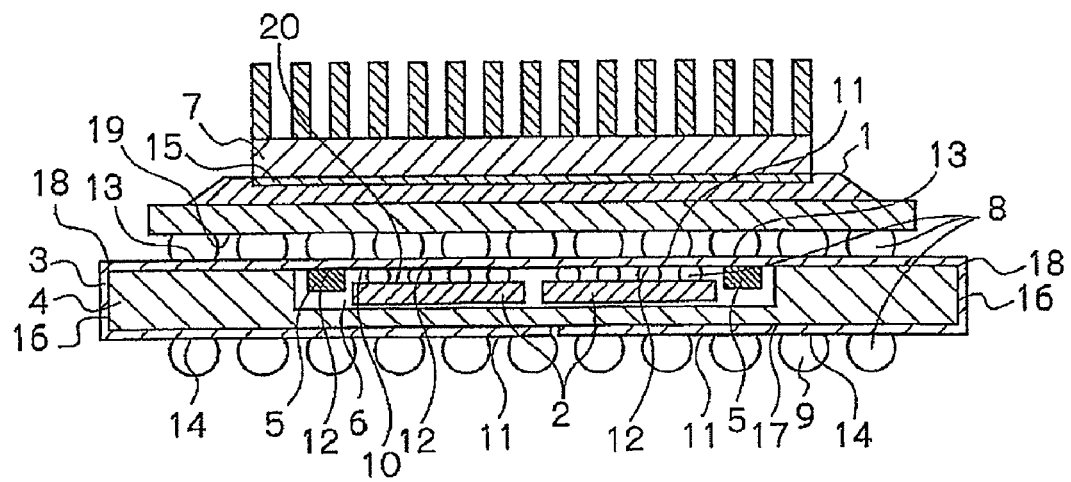
FIGS. 1A to 1C are sectional views illustrating a semiconductor device according to a first exemplary embodiment of this invention.

DESCRIPTION OF SYMBOLS 1 computing processor device
2 memory device
3 flexible circuit board
4 supporter
5 passive part
6 groove
7 heat sink
8 solder bump (or solder ball)
9 external terminal of semiconductor device
10 first face of flexible circuit board
11 second face of flexible circuit board
12 first external electrode on first face side of flexible circuit board
13 second external electrode on second face side of flexible circuit board
14 third external electrode on second face side of flexible circuit board
15 heat spreader
16 side face of supporter
17 face of supporter which is opposite to face where groove is formed
18 side of supporter
19 external terminal face of computing processor device
20 external terminal face of memory device
21 plate with through hole (component of supporter)
22 flat plate
23 through hole
24 heat conducting material
25 printed circuit board
26 semiconductor device of this invention
27 semiconductor device of first embodiment of this invention
28 DDR-DRAM bare chip
29 adhesive layer
30 wiring pattern
31 first insulating layer
32 second insulating layer
33 third insulating layer
34 fourth insulating layer
35 fifth insulating layer
36 sixth insulating layer
37 seventh insulating layer
38 via or through hole
39 projection
40 through hole or groove connected to projection
41 region of flexible circuit board bent along supporter
42 region where number of wiring layers is small
43 outermost portion
101 computing processor package
102 memory package
103 passive part
104 printed circuit board
201 sealing resin
202 solder bump
203 Au wiring line
204 bare semiconductor chip or computing processor device (bare chip)
205 bare semiconductor chip or memory (bare chip)
206 interposer substrate
207 adhesive layer
301 first semiconductor chip
302 second semiconductor chip
303 bump
304 pad
305 center reinforcement member
306 flexible circuit board (flexible board)
307 solder ball
308 plate-shaped reinforcement member
309 hole
401 LSI
402 rigid wiring board
403 flexible wiring board
404 underfill
405 solder ball
406 motherboard
407 adhesive resin
501 wiring line in first layer of printed board
502 wiring line in second layer and third layer of printed board
503 wiring line in fourth layer of printed board
504 computing processor device
505 DC power supply
506 via or through hole
507 printed circuit board
601 wiring line in first layer of printed board
602 wiring line in second layer and third layer of printed board
603 wiring line in fourth layer of printed board
604 computing processor device
605 DC power supply
606 via or through hole
607 decoupling capacitor
608 printed circuit board

BEST MODE FOR CARRYING OUT THE INVENTION

Exemplary Embodiments

Exemplary Embodiments of this invention are described in detail below with reference to the drawings.

First Exemplary Embodiment

Figure 1B:
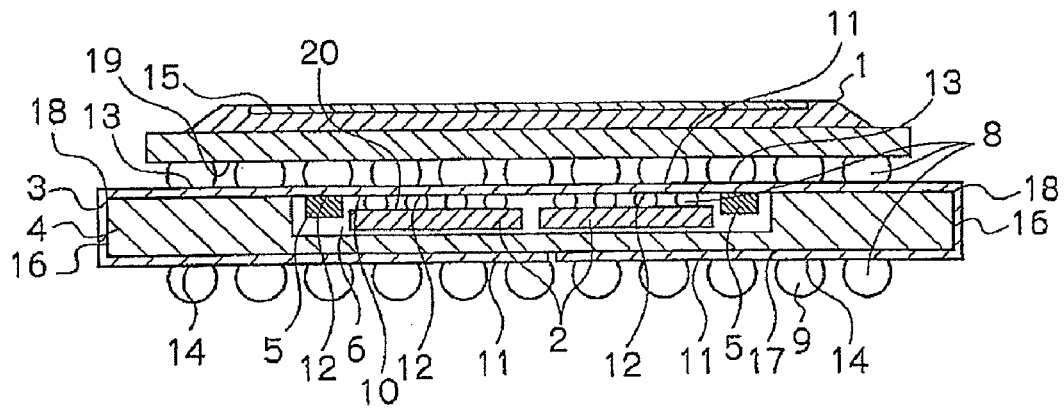
Figure 1C:
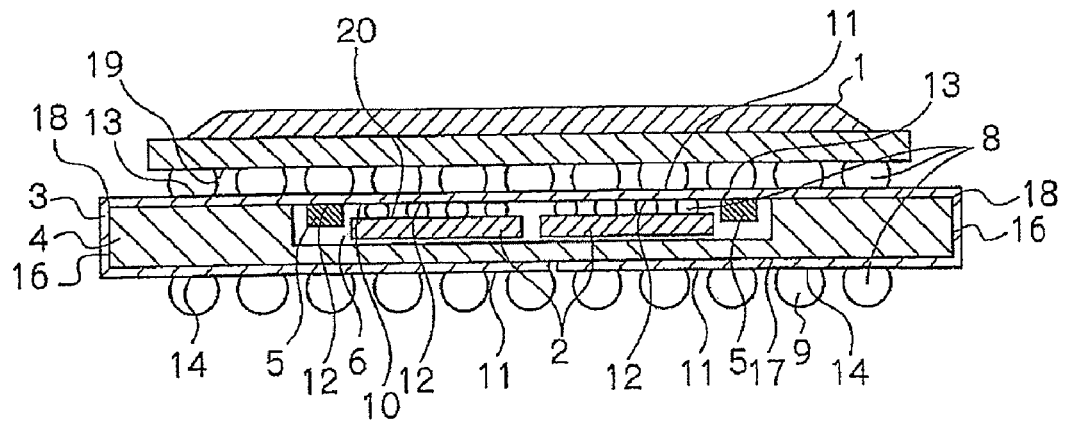
Figure 2:
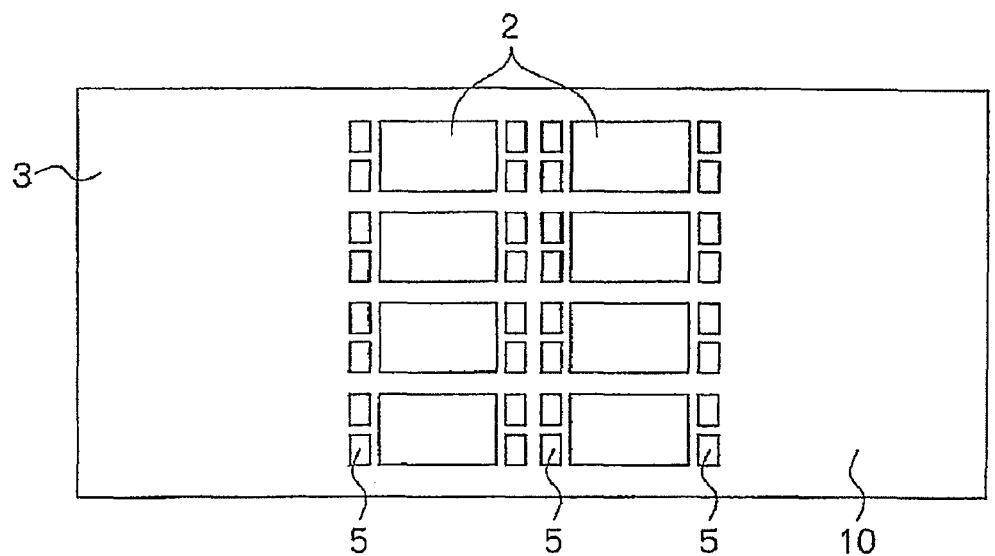
FIG. 2 is a diagram (top view) of a flexible circuit board used in the semiconductor device of this invention, with a plurality of memory devices and a plurality of passive parts mounted flatly to a first face of the flexible circuit board.
Figure 3:
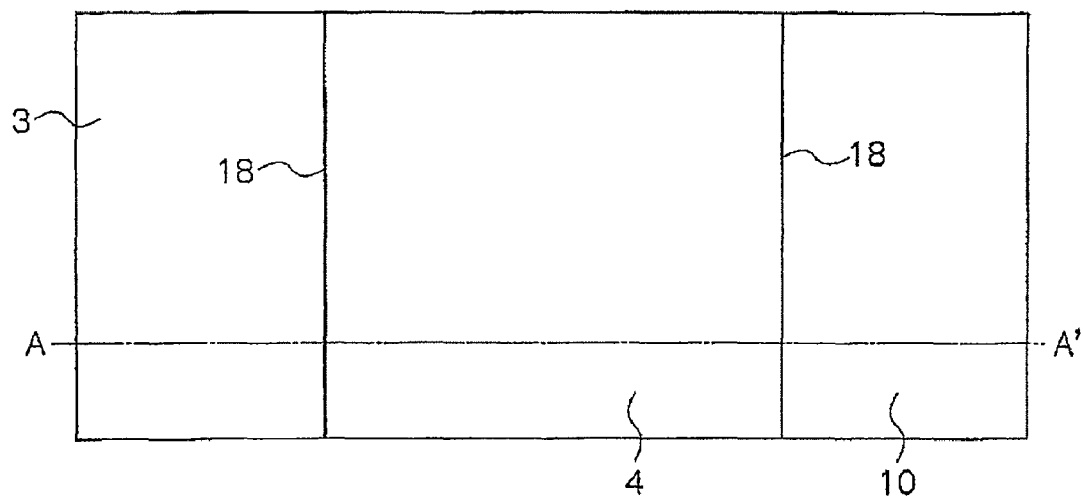
FIG. 3 is a diagram (top view) in which, after the plurality of memory devices and the plurality of passive parts are mounted to the flexible circuit board, a supporter is adhered to the first face of the flexible circuit board, or connected to a first external electrode formed on the first face, so as to enclose those parts, on the premise that the flexible circuit board is to be bent along two sides of the supporter.
Figure 4:
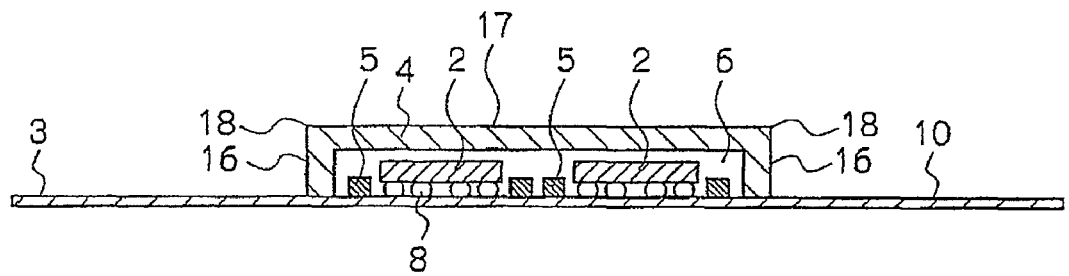
FIG. 4 is a sectional view taken along the line A-A' of FIG. 3.

FIGS. 1A to 1C are sectional views of a semiconductor device according to a first exemplary embodiment of this invention. FIG. 2 is a plan view (top view) of a flexible circuit board 3 used in a semiconductor device of this invention, with a plurality of memory devices 2 and a plurality of passive parts 5 mounted flatly on a first face of the flexible circuit board 3. FIG. 3 is a plan view (top view) in which, after the plurality of memory devices 2 and the plurality of passive parts 5 are mounted to the flexible circuit board 3, a supporter 4 with a groove 6 for housing those parts is adhered to the first face 10 of the flexible circuit board 3, or connected to a first external electrode 12 formed on the first face 10, so as to enclose those parts. FIG. 4 is a sectional view taken along the line A-A' of FIG. 3.

The semiconductor device according to the first exemplary embodiment of this invention that is illustrated in FIG. 1A includes: one flexible circuit board 3 which has the first external electrode 12 on the first face 10, which has a second external terminal 12 and a third external terminal 14 on a second face 11, and which includes at least two wiring layers; the plurality of memory devices 2; the plurality of passive parts 5 which include at least one type out of a resistor, a capacitor, and an inductor; the supporter 4 which is provided with at least one groove 6 for housing the plurality of memory devices 2 and the plurality of passive parts 5; and one computing processor device 1 which includes a heat spreader 15 and a heat sink 7.

The semiconductor device according to the first exemplary embodiment of this invention that is illustrated in FIG. 1B has the structure in which only the heat sink 7 is removed from the structure illustrated in FIG. 1A. In the case where the heat spreader 15 provided in the computing processor device 1 is capable of cooling the semiconductor device down to an operating temperature by itself, the structure of FIG. 1B which does not include the heat sink 7 may be employed.

The semiconductor device according to the first exemplary embodiment of this invention that is illustrated in FIG. 1C has the structure in which only the heat spreader 15 is removed from the structure illustrated in FIG. 1B. In the case where the computing processor device is not provided with the heat spreader 15 nor the heat sink 7 but the semiconductor device may be cooled down to an operating temperature by using an external cooling fan or water cooling system, the structure of FIG. 1C which does not include the heat sink 7 and the heat spreader 15 may be employed. Those are true in all of the following exemplary embodiments.

The flexible circuit board 3 has a wiring layer structure with at least two layers so that a signal wiring/ground (microstrip line) structure may be built. The number of wiring layers, which is determined by a manufacture margin for wiring width/space, restrictions put on wiring rules, and other factors, may be three or four, for example. Preferably, the number of wiring layers is reduced as much as possible because the flexible circuit board 3 having a fewer wiring layers is manufactured through less manufacturing steps and at an accordingly lowered cost.

The plurality of memory devices 2 include volatile or nonvolatile memories such as DRAMs, Static Random Access Memories (SRAMs), and flash memories in the form of a bare chip or a package that may be subjected to a burn-in test or a function test (TSOP-type package, BGA-type package, or the like). For example, the memory devices 2 may consist solely of a plurality of DRAMs or may be built from different types of memories such as a combination of DRAMs and flash memories or a combination of DRAMs and SRAMs.

The package form that may be put to a burn-in test or a function test (TSOP, BGA, or the like) is preferred to the bare chip form for the computing processor device 1 and the plurality of memory devices 2 because of such advantages as high overall yield in semiconductor device assembly, less investment for testing, the ease of guaranteeing quality, and high reliability. The computing processor device 1 is generally large in power consumption (for example, 5 W or more) and needs to be equipped with the heat spreader 15 and/or the heat sink 7. Employing a BGA-type package that is equipped with the heat spreader 15 and/or the heat sink 7 in advance is therefore preferable to mounting the heat spreader 15 and/or the heat sink 7 later. The use of a BGA-type package is preferred for the memory devices 2 as well because the outer size is smaller in a BGA-type package than in a TSOP.

In order to enhance the performance of the semiconductor device, DRAMs used for the memory devices 2 are preferably ones that operate at high speed (clock frequency: 100 MHz or higher), such as double data rate DRAMs (DDR-DRAMs), DDR2-DRAMs, and DDR3-DRAMs which are capable of high-speed random access to the computing processor device 1, and that have as large a storage capacity as possible.

The passive parts 5 have functions of a resistor, a capacitor, and an inductor, and may be shaped like a chip or a thin film or, in the case of a capacitor, a column as in a field capacitor. The computing processor device 1 may be built from various central processing units (CPUs) such as an image processing processor and an audio processing processor.

Particularly preferred applications of this invention include three-dimensional image processing modules requiring a large-capacity and high-speed memory and electronic devices capable of high-definition image processing where an effect of this invention in that the wiring distance from the computing processor device 1 to the plurality of memory devices 2 is shortened is utilized. In those applications, the plurality of memory devices 2 are preferably DRAMs, more specifically, high-speed DRAMs such as DDRs, DDR2s, or DDR3s, and the computing processor device 1 is preferably an image processing processor.

The supporter 4 is made of a metal material, a ceramic material, glass, Si, a resin substrate, a layered material of resin and metal foil, or the like, preferably from a material that is inexpensive and has excellent levelness. A material selected from those is etched with the use of a chemical to form the groove 6. In the case of a metal material, a resin substrate, or a layered material of resin and metal foil, a mold may be used to form the groove 6. Made of an inexpensive level material, the supporter 4 gives the semiconductor device to which solder balls have been mounted as bumps 8 excellent coplanarity and a high secondary packaging yield.

Preferably, the supporter 4 is at least partially made of a material selected from the group consisting of an alloy containing Ni such as alloy 42 or Kovar, ceramics, and Si. It is particularly preferable if a portion of the supporter that is adhered or connected to the flexible circuit board 3 is made of a material selected from the group consisting of an alloy containing Ni such as alloy 42 or Kovar, ceramics, and Si. Those materials have as small a linear expansion coefficient as 3 ppm to 5 ppm and are accordingly helpful in preventing the flexible circuit board 3 which is placed over the groove 6 of the supporter 4 from warping and from developing surface irregularities, thereby avoiding defective packaging ("open defect") of the computing processor device 1 mounted to the flexible circuit board 3 over the groove 6. As a result, a semiconductor device with a high assembly yield is realized.

In the case where the supporter 4 is made of a metal material, or in the case where a metal material is used in a portion of the supporter 4, the metal material which is conductive is preferably connected electrically to a ground for the flexible circuit board 3. When the supporter 4 made of a metal material is electrically connected to the ground for the flexible circuit board 3, the electric potential of the supporter 4 is steadied and a ground for the entire semiconductor device is strengthened, which means that the semiconductor device may have a ground with no or few electric potential fluctuations and may operate steadily.

As illustrated in FIGS. 2 and 3, the flexible circuit board 3 is larger in area than the supporter 4 (FIG. 3), and the plurality of memory devices 2 and the plurality of passive parts 5 are mounted flatly to the first face 10 of the flexible circuit board 3 (FIG. 2) and are electrically connected to the first external electrode 12 formed on the first face 10 (in FIG. 2 which is a plan view viewed from above, the first external electrode 12 formed on the first face 10 is hidden under the memory devices 2 and the passive parts). The passive parts 5 are mounted in the vicinity of the memory devices 2. The supporter 4 is adhered to the first face 10 of the flexible circuit board 3, or electrically connected to the first electrode terminal 12 provided on the first face 10, so as to enclose the plurality of memory devices 2 and the plurality of passive parts 5. The plurality of memory devices 2 and the plurality of passive parts 5 are housed inside the groove 6 of the supporter 4.

The flexible circuit board 3 is bent along at least one side 18 of the supporter 4 (in FIG. 3, along two opposing sides of the supporter 4). The bent flexible circuit board 3 is wrapped around at least one side face 16 (in FIG. 3, two side faces) of the supporter 4 and a face 17 of the supporter 4 which is opposite to the face where the groove is formed, and is adhered to the face of the supporter 4.

The flexible circuit board 3 may be adhered to the supporter 4 by a method in which a thermally curable adhesive is applied in advance to a surface of the supporter 4, the flexible circuit board 3 is bent and temporarily adhered, and lastly the adhesive is cured thermally. This method, however, has difficulties in keeping the thickness of the applied adhesive uniform and arises a problem in that the flexible circuit board 3 adhered to the surface of the supporter 4 develops large surface irregularities. Another problem is that the liquid-form or gel-form thermally curable adhesive seeps out from a gap between the supporter 4 and the flexible circuit board 3 which needs to be removed later through an additional and laborious step, which increases the manufacture cost.

In order to remedy those problems, the flexible circuit board 3 preferably has a thermoplastic adhesive resin film, or an uncured thermally curable adhesive resin film, attached in advance to a portion of the first face of the flexible circuit board 3 that is to be adhered to a surface of the supporter 4. With this structure, the flexible circuit board 3 is bent while heated and is readily adhered to a surface of the supporter 4. The structure also remedies the inconvenience of the adhesive seeping out of the flexible circuit board 3 and the supporter 4 and reduces fluctuations in the thickness of the adhesive layer. Accordingly, surface irregularities of the flexible circuit board 3 are reduced and the obtained semiconductor device has a high assembly yield and high secondary packaging reliability when mounted to a printed board.

As illustrated in FIG. 1, on a face opposite to the first face 10, where the plurality of memory devices 2 and the plurality of passive parts 5 are mounted and the first external electrode 12 is provided, a second external electrode 13 of the flexible circuit board 3 is provided, the computing processor device 1 is electrically connected to the second external electrode 13, and an external terminal face 19 of the computing processor device 1 faces external terminal faces 20 of the plurality of memory devices 2 as well as the plurality of passive parts with the flexible circuit board 3 interposed therebetween. In a semiconductor device of this invention, the specifications of the computing processor device 1 are determined in most cases at the first stage of designing the semiconductor device, and the computing processor device 1 is often a large-sized device such as a flip chip BGA (FCBGA). Then the semiconductor device is preferably designed such that, when the area of the computing processor device 1 is the base, the combined area of the plurality of memory devices 2 and the plurality of passive parts 5 is smaller than the area of the computing processor device 1. This is preferable because the overall outer size of the semiconductor device is minimized as a result.

The face 17 opposite to the face of the supporter 4 where the groove 6 is formed also has a third external electrode 14 of the flexible circuit board 3. The solder bumps 8 are formed on the third external electrode 14 to serve as external terminals 9 of the semiconductor device.

When the solder bumps 8 (external terminals 9 of the semiconductor device) are defined as a bottom face, the computing processor device 1 is mounted on the topmost face, more specifically, the heat sink attached to the computing processor device 1 constitutes the topmost face. Of devices that constitute a semiconductor device of this invention, the computing processor device 1 is generally the device that consumes power most. However, by employing a structure in which the computing processor device 1 is placed on the topmost face of the semiconductor device, heat generated by the computing processor device 1 is efficiently let out and heat transmission to memories mounted nearby may be avoided as much as possible.

Figure 5:
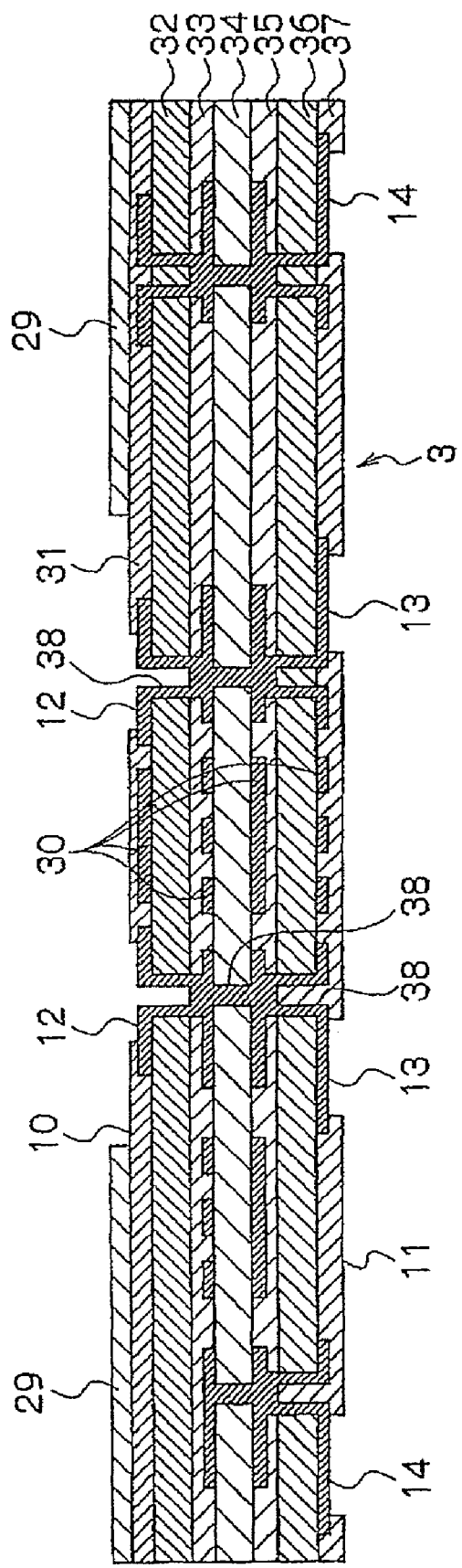
FIG. 5 is a sectional view of an example of the flexible circuit board used in the semiconductor device of this invention.

FIG. 5 is a sectional view of an example of a flexible circuit board used in a semiconductor device of this invention. In the example of FIG. 5, the number of wiring layers of the flexible circuit board 3 is four. A first insulating layer 31 and a seventh insulating layer 37 in FIG. 5 are made of, for example, a solder resist or a pre-preg material. When a solder resist is employed, the employed material needs to be capable of withstanding the temperature in a reflow step (in the case of Pb-free solder such as SnAg, SnAgCu, and SnCu, the peak temperature is approximately 250° C. to 260° C.). The employed material also needs to be capable of preventing the bent flexible circuit board 3 from cracking or tearing. It is generally preferable to use a polyimide base for a second insulating layer 32, a fourth insulating layer 34, and a sixth insulating layer 36. A third insulating layer 33 and a fifth insulating layer 35 are each an adhesive for adhering an insulating layer on each side of the adhesive insulating layer, and those, too, are made of a material that withstands the temperature in a reflow step (in the case of Pb-free solder such as SnAg, SnAgCu, and SnCu, the peak temperature is approximately 250° C. to 260° C.).

A portion of the flexible circuit board 3 that is bent along the supporter 4 is preferably lowered in wiring material occupation ratio than the rest of the flexible circuit board 3 (and set to, for example, 50% or less) in order to facilitate the bending of the flexible circuit board 3 (in order to make the portion require less external force to bend) and in order to reduce a repulsive force which is generated upon bending of the flexible circuit board 3 and acts to put the flexible circuit board 3 back to its original shape (in order to facilitate adhesion to the supporter by reducing the repulsive force). Alternatively, for the same purpose, the portion to be bent is preferably smaller in the number of wiring layers than that of the other portions which are not to be bent (and smaller in wiring material occupation ration as a result). To give a preferred example, the number of wiring layers in the portion to be bent is set to three whereas the other portions which are not to be bent have four wiring layers.

Wiring patterns 30 in different layers are connected to one another by a via or a through hole 38. The flexible circuit board 3 has the first face 10 on which the first external electrode 12 is provided and the second face 11 on which the second external electrode 13 and the third external electrode 14 are provided. In the first exemplary embodiment, the plurality of memory devices 2 and the plurality of passive parts 5 are connected to the first external electrode 12. Connected to the second external electrode 13 is the computing processor device 1, and connected to the fourth external electrode 14 are the solder balls (or solder bumps) 8, which serve as the external terminals 9 of the semiconductor device.

On the first face 10 of the flexible circuit board 3, an adhesive layer 29 which is one of components of the semiconductor device is further formed in a portion where the flexible circuit board 3 is adhered to a surface of the supporter 4. The adhesive layer 29 is preferably a thermoplastic adhesive resin film or an uncured thermally curable adhesive resin film. While the number of wiring layers is four in the example of FIG. 5, there may be two wiring layers or three wiring layers if micro-strip lines may be formed as transmission paths and wires may be routed. The number of wiring layers may also be five or more. While the adhesion layer 29 is formed on the first face 10 in the example of FIG. 5, the adhesive layer 29 may be omitted from the flexible circuit board 3 by forming an adhesive layer in advance on the surface of the supporter 4. In the example of FIG. 5, the first external electrode 12 is provided in two places, the second external terminal electrode is provided in two places, and the third external electrode 14 is provided in two places. In practice, many more first, second, and third external terminals are provided in numbers determined by the number of external terminals of devices used.

Figure 6:
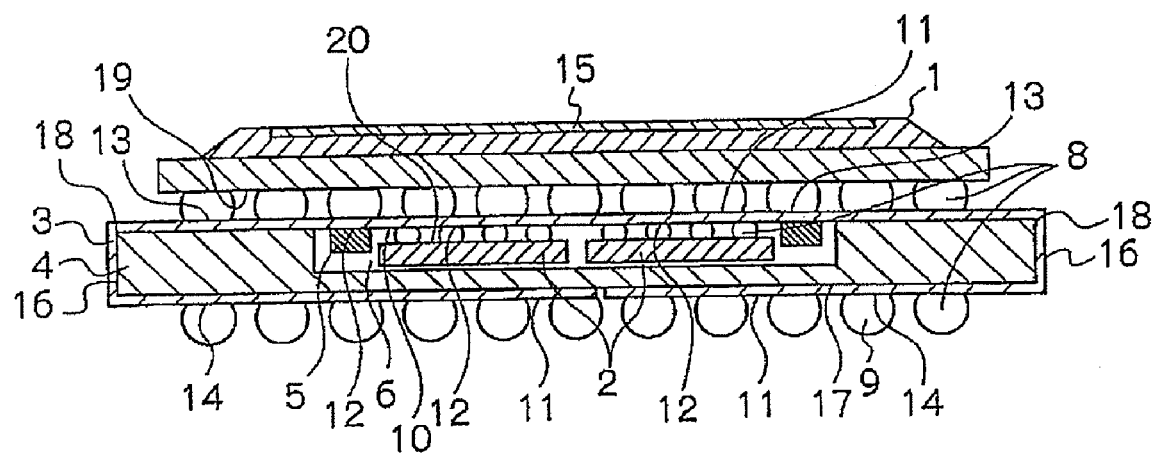
FIG. 6 is a sectional view illustrating a modification example of the first exemplary embodiment of this invention.

FIG. 6 is a diagram illustrating a simple modification example of the first exemplary embodiment of this invention. While the heat sink 7 is attached to the computing processor device 1 in the first exemplary embodiment of this invention which is illustrated in FIG. 1, a structure without the heat sink 7 may be employed as in the example of FIG. 6 if the heat spreader 15 may provide a sufficient cooling function by itself.

Figure 7:
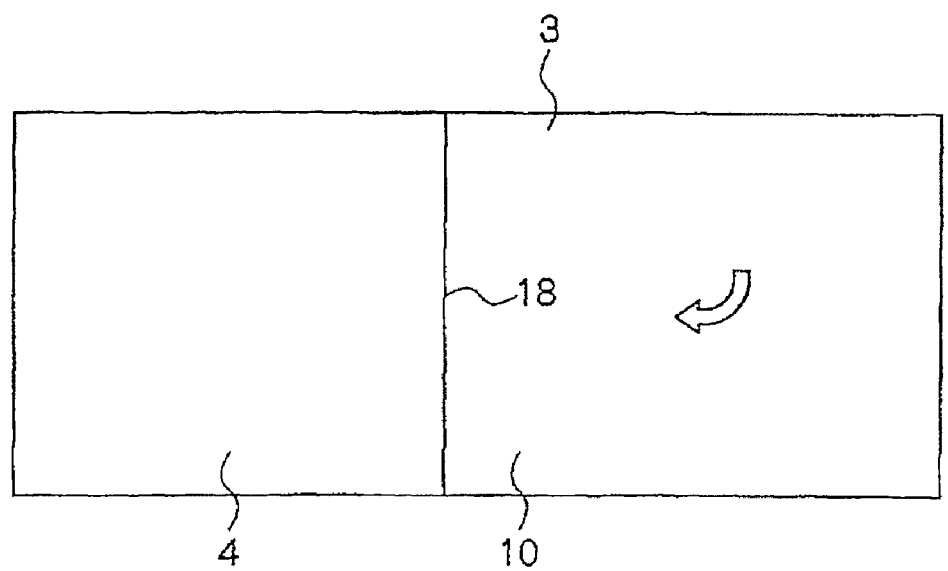
FIG. 7 is a diagram (top view) in which, after the plurality of memory devices and the plurality of passive parts are mounted to the flexible circuit board, the supporter is adhered to the first face of the flexible circuit board, or connected to the first external electrode formed on the first face, so as to enclose those parts, on the premise that the flexible circuit board is to be bent along one side of the supporter.
Figure 8:
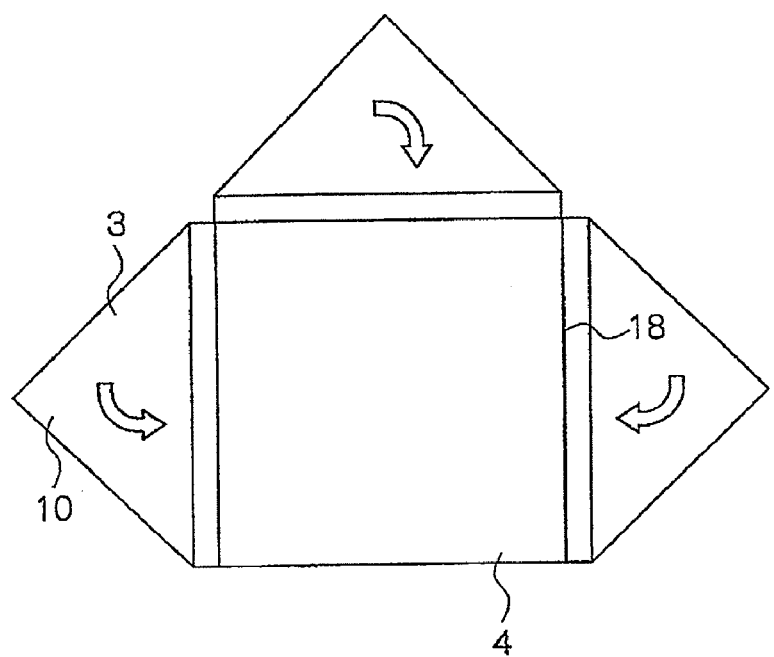
FIG. 8 is a diagram (top view) in which, after the plurality of memory devices and the plurality of passive parts are mounted to the flexible circuit board, the supporter is adhered to the first face of the flexible circuit board, or connected to the first external electrode formed on the first face, so as to enclose those parts, on the premise that the flexible circuit board is to be bent along three sides of the supporter.
Figure 9:
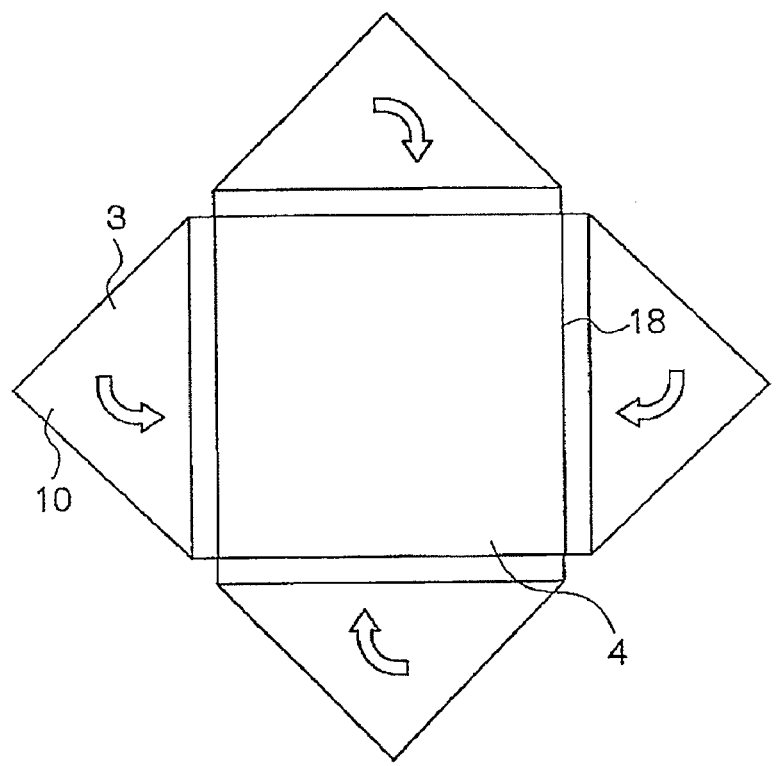
FIG. 9 is a diagram (top view) in which, after the plurality of memory devices and the plurality of passive parts are mounted to the flexible circuit board, the supporter is adhered to the first face of the flexible circuit board, or connected to the first external electrode formed on the first face, so as to enclose those parts, on the premise that the flexible circuit board is to be bent along four sides of the supporter.

FIGS. 7 to 9 are explanatory diagrams of bending structure examples of the flexible circuit board 3. While bending the flexible circuit board 3 along two sides of the supporter 4 is chosen in the first exemplary embodiment, a different structure may be employed such as a structure of FIG. 7 in which the flexible circuit board 3 is bent along one side of the supporter 4, a structure of FIG. 8 in which the flexible circuit board 3 is bent along three sides of the supporter 4, or a structure of FIG. 9 in which the flexible circuit board 3 is bent along four sides of the supporter 4. Preferably, an optimum way of bending the flexible circuit board 3 is selected by considering which structure reduces the number of wiring layers more than other structures, which structure facilitates the step of bending the flexible circuit board 3 more than other structures, or the like.

A manufacturing method according to the first exemplary embodiment of this invention is described next. FIGS. 10A to 10E are step diagrams illustrating an example of the manufacturing method according to the first exemplary embodiment of this invention.

Figure 10A:
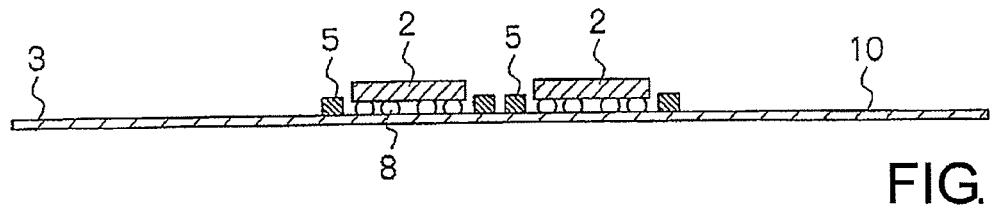
FIGS. 10A to 10E are diagrams illustrating a manufacturing method according to the first exemplary embodiment of this invention.

First, flux or solder paste is applied onto the first external terminal 12 on the first face 10 of the flexible circuit board 3, the plurality of memory devices 2 and the plurality of passive parts 5 are mounted temporarily to the first external electrode, and the solder is melted through a reflow step to mount those devices to the first face of the flexible circuit board 3 (FIG. 10A). In this step of manufacturing the flexible circuit board 3, the plurality of passive parts 5 may be mounted to the first face 10 of the flexible circuit board 3 in advance if the semiconductor device may be manufactured at a lower cost that way.

Figure 10B:
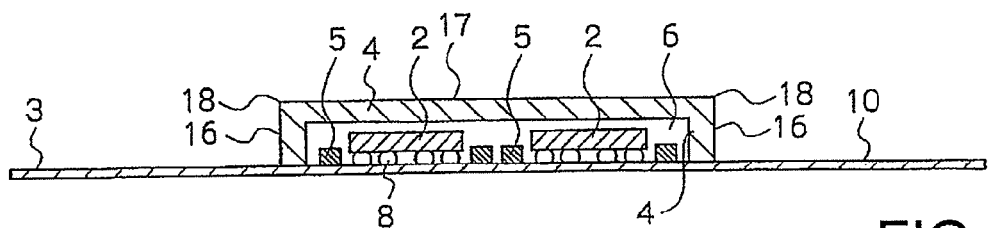

Next, the supporter 4 which has the groove 6 for housing the plurality of memory devices 2 and the plurality of passive parts 5 is connected to the first external electrode 12 (coupled to the ground in the flexible circuit board 3) on the first face 10 of the flexible circuit board 3 with the use of solder or a conductive adhesive (FIG. 10B). The supporter 4 is mounted so as to enclose the plurality of passive parts 5. In the case where solder is employed to connect the supporter 4 and the flexible circuit board 3, a reflow machine is used and it is preferable to perform the mounting of the plurality of memory devices 2 and the mounting of the plurality of passive parts 5 at once in order to reduce thermal history. In the case where a conductive adhesive is used to adhere the supporter 4 to the flexible circuit board 3, the adhesive may be thermally cured with the use of an oven or a hot plate immediately after the adhesion, or at some point in the subsequent semiconductor device manufacturing steps, or in the last semiconductor device manufacturing step. When the employed material requires only a short time to be cured thermally, the material is thermally cured in a scheduled reflow step and no special thermal curing process needs to be added.

Alternatively, the supporter 4 may be adhered to a surface (insulating layer) of the flexible circuit board 3 with the use of an insulative adhesive. The insulative adhesive is thermally cured in the same step as described for the case where a conductive adhesive is used.

Figure 10C:
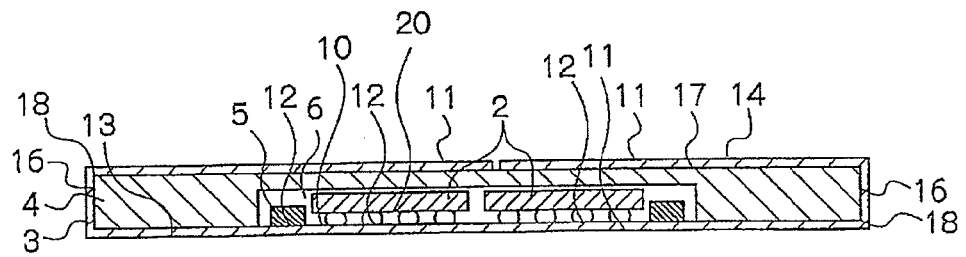

Next, the flexible circuit board 3 is bent along the perimeter of the supporter 4 to be adhered to the side face 16 of the supporter 4 and to the face 17 of the supporter 4 which is opposite to the face where the groove is formed (FIG. 10C).

Figure 10D:
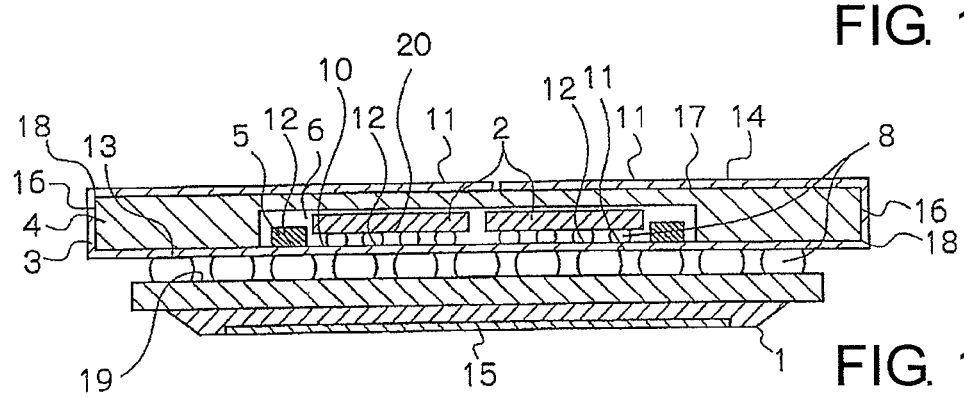
Figure 10E:
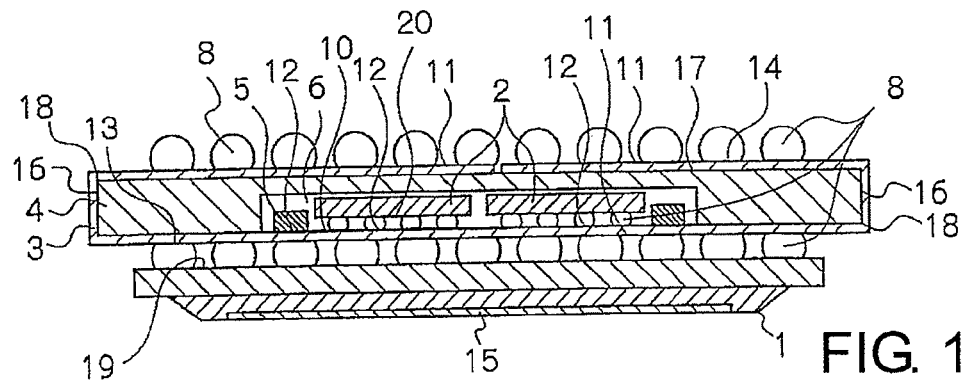

Flux or solder paste is next applied to the second external electrode 13 on the second face 11 of the flexible circuit board 3. The face where the second external electrode 13 is provided is opposite to the first external electrode 12 of the flexible circuit board 3 on which the plurality of passive parts 5 is mounted. The computing processor device 1 is then laid on top (stacked) and connected by solder with the use of a reflow machine (FIG. 10D).

Figure 18:
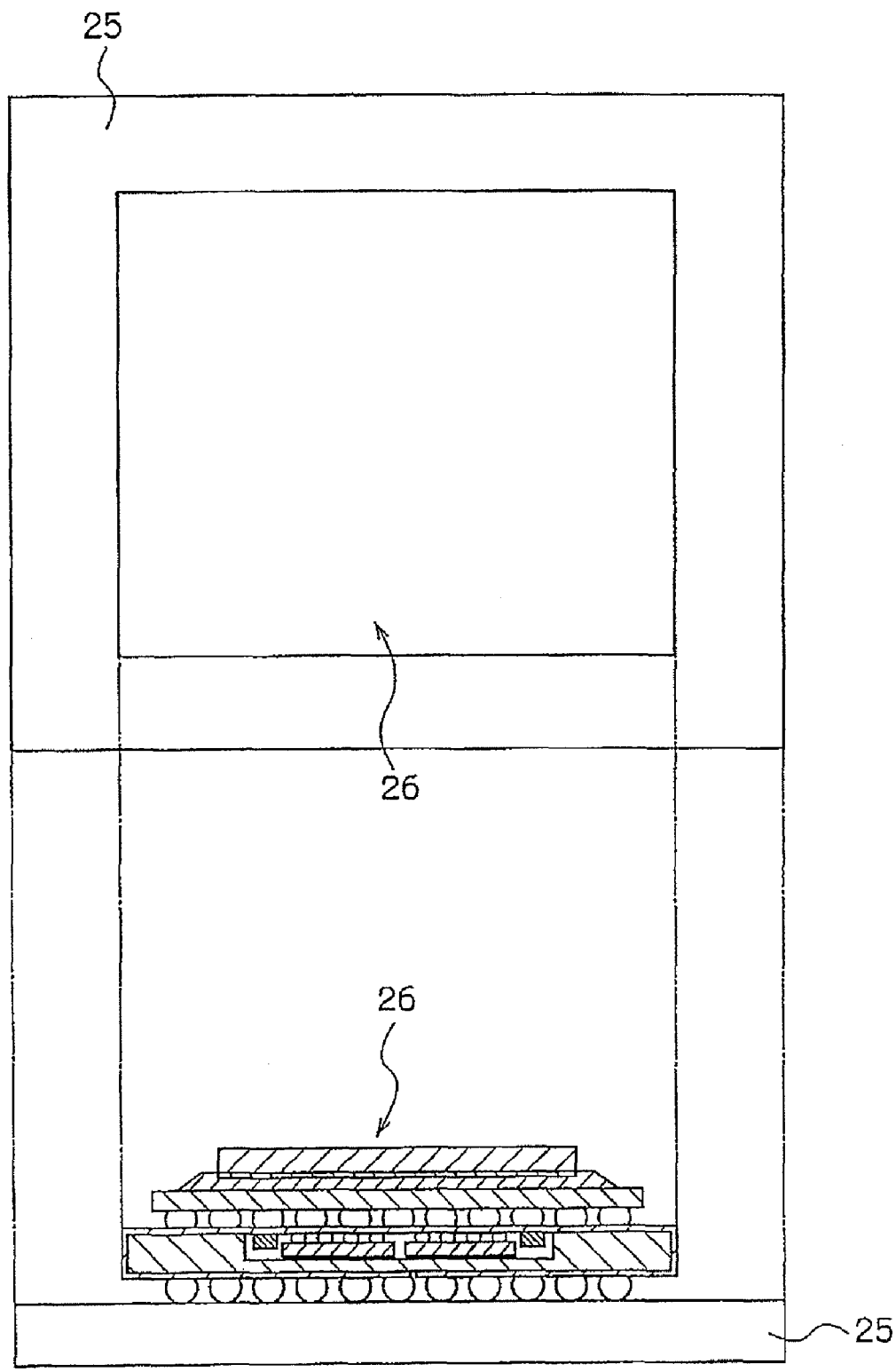
FIG. 18 is a diagram of a printed board to which a semiconductor device of this invention is mounted according to a ninth exemplary embodiment of this invention.

Lastly, flux is applied to the third external electrode 14 on the flexible circuit board 3 adhered on the side of the face 17 of the supporter 4 which is opposite to the face where the groove 6 is formed, and a solder ball transfer method and a reflow machine are used to form the solder bumps 8 (FIG. 18). The combination of flux application and solder ball transfer may be replaced by a print method in which solder paste is printed directly onto the third external terminal without applying flux. The first exemplary embodiment of this invention (FIG. 1A) is thus completed.

The step of stacking the computing processor device 1 and a package in which the supporter 4 encloses the plurality of memory devices 2 and the plurality of passive parts 5 and the flexible circuit board 3 is wrapped around the supporter 4 (FIG. 10D) and the step of forming the solder bumps 8 on the third external electrode 14 (FIG. 10E) are preferably executed simultaneously with the use of a reflow machine. In semiconductor device manufacturing steps, thermal history is reduced as much as possible in order to enhance the reliability of the semiconductor device.

With the thus structured manufacturing method, a three-dimensional packaging semiconductor device in which a computing processor device is combined with a plurality of passive parts as in this invention may readily be manufactured and the obtained three-dimensional packaging semiconductor device is high in reliability.

As described above, according to the first exemplary embodiment of this invention, a three-dimensional packaging semiconductor device is provided which is small-sized and thin despite being built from a combination of many devices including the computing processor device 1, the plurality of memory devices 2, and the plurality of passive parts 5, which has no trouble operating when a high-speed processor and a high-speed memory are used, which is more high-performance owing to a plurality of memories used, which has excellent heat dissipation characteristics, which is free in the selection of a processor without needing to take the power consumption of the processor into consideration, which has a high assembly yield, and which is high in packaging reliability and low in cost.

Second Exemplary Embodiment

Figure 11:
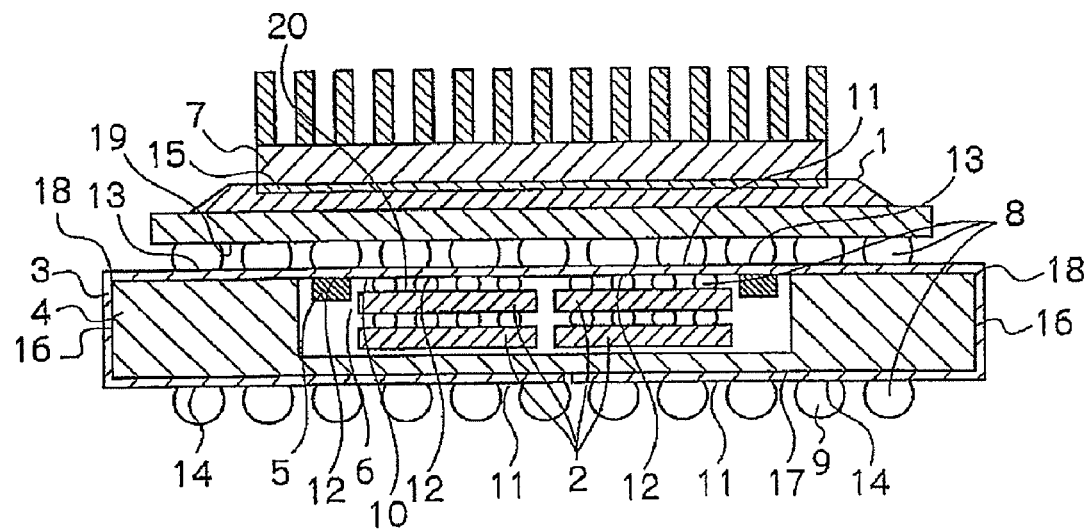
FIG. 11 is a sectional view of a semiconductor device according to a second exemplary embodiment of this invention.

FIG. 11 is a sectional view of a semiconductor device according to a second exemplary embodiment of this invention. The second exemplary embodiment of this invention illustrated in FIG. 11 is structured similarly to the first exemplary embodiment of this invention illustrated in FIG. 1, but differs from the first exemplary embodiment in that stacks of BGA-type packages (so-called package-on-package structure) are used.

FIG. 11 illustrates a structure in which two BGA-type packages constitute each stack. However, the packages are not limited to the BGA-type packages, and TSOP-type packages which have leads as external terminals may be stacked. While two stacks each constituted of two packages are used in FIG. 11, three or more stacks may be used as long as area restrictions permit. Each stack may be constituted of three or more packages as long as height restrictions permit. A single package may be included among stacks of packages. The single package may be a multi-chip package which contains a plurality of memory bare chips inside. The term "multi-chip package" refers to a packaging mode in which a plurality of bare chips is stacked three-dimensionally in a single package and a packaging mode in which a plurality of bare chips is flatly laid out in a single package. In short, devices of any modes may be combined as long as a memory capacity necessary for the semiconductor device is implemented. This exemplary embodiment is characterized in that a semiconductor device may have a large memory capacity.

Third Exemplary Embodiment

Figure 12:
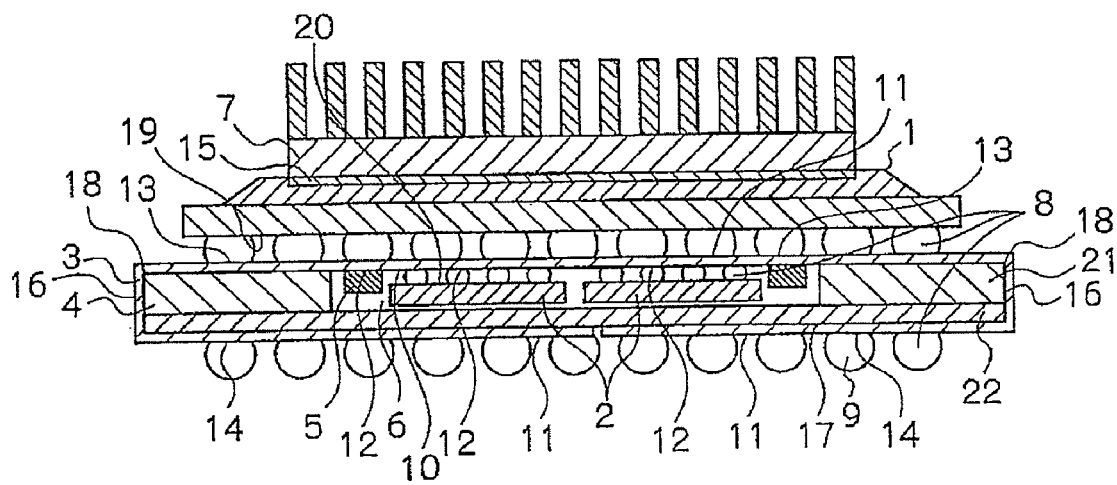
FIG. 12 is a sectional view of a semiconductor device according to a third exemplary embodiment of this invention.

FIG. 12 is a sectional view of a semiconductor device according to a third exemplary embodiment of this invention. The third exemplary embodiment of this invention illustrated in FIG. 12 is structured similarly to the first exemplary embodiment of this invention illustrated in FIG. 1, but differs from the first exemplary embodiment in that the supporter 4 is created by stacking a plate 21 with a through hole and a flat plate 22. According to this exemplary embodiment, a supporter may be manufactured at a lower cost than in the first exemplary embodiment of this invention illustrated in FIG. 1, where the groove 6 is formed in a single flat plate material by etching or with the use of a mold. In addition, this exemplary embodiment allows a supporter to be created from a combination of different materials, and hence the supporter may meet such requirements as being low in linear expansion coefficient, being light-weight, and being inexpensive, more easily than when the supporter is created from a single material.

Further, the third exemplary embodiment of this invention, it is preferable that at least a portion of the supporter 4, specifically, the plate 21 provided with a through hole, is made of an alloy containing Ni such as alloy 42 or Kovar. Those alloy materials have as small a linear expansion coefficient as 3 ppm to 5 ppm and are accordingly helpful in preventing the flexible circuit board 3 which is placed over the groove 6 of the supporter 4 from warping and from developing surface irregularities, thereby avoiding defective packaging (open defect) of the computing processor device 1 which is mounted to the flexible circuit board 3 over the groove 6. As a result, a semiconductor device with a high assembly yield is realized.

In the third exemplary embodiment of this invention, it is preferable that at least a portion of the supporter 4, specifically, the flat plate 22, is made of a material selected from the group consisting of aluminum, an aluminum alloy, titanium, a titanium alloy, ceramics, and Si. Those materials are small in specific gravity and accordingly may make the supporter 4 light-weight. When the supporter 4 is heavy-weighted, solder balls serving as the external terminals 9 are crushed significantly by the own weight of the semiconductor device in secondary packaging where the semiconductor device is mounted to a printed board, which increases the risk of short circuit between adjacent solder balls and lowers the packaging yield. With this structure, the short circuit defect is remedied and a semiconductor device that has a high assembly yield is realized.

While FIG. 12 illustrates a structure in which one plate 21 with a through hole and one flat plate 22 are stacked, this exemplary embodiment is not limited to a case where one plate 21 with a through hole and one flat plate 22 are used. Two or more plates 21 with a through hole and two or more flat plates 22 may be used or, for example, two plates with a through hole and one flat plate may be stacked. In short, the supporter 4 may be created from any combination as long as the flexible circuit board 3 placed over the groove in the supporter 4 is prevented from warping or developing surface irregularities, and as long as the combination realizes the supporter 4 having light weight.

Preferably, the components stacked to constitute the supporter 4 are at least partially adhered or connected to one another via a conductive or insulative material, or at least partially welded to one another (by, for example, spot welding). If the stacked components are not fixed to one another, the plurality of stacked components are shifted with respect to each other in the step of bending the flexible circuit board 3 to be adhered to the circumference of the supporter 4, which may cause an assembly defect. However, according to this exemplary embodiment, the supporter 4 may have a stable shape and, as a result, a semiconductor device high in assembly yield is realized.

Fourth Exemplary Embodiment

Figure 13A:
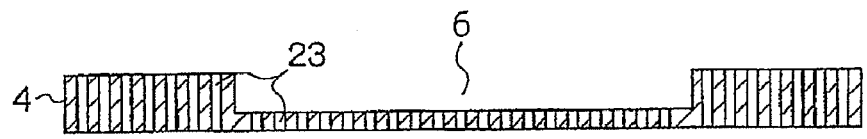
FIGS. 13A to 13E are diagrams illustrating the characteristics of a supporter that is used in a fourth exemplary embodiment of this invention, FIGS. 13A to 13D being sectional views, FIG. 13E being a plan view viewed from above the groove side.
Figure 13B:
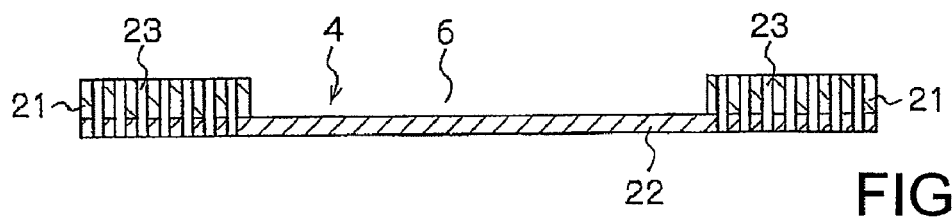
Figure 13C:
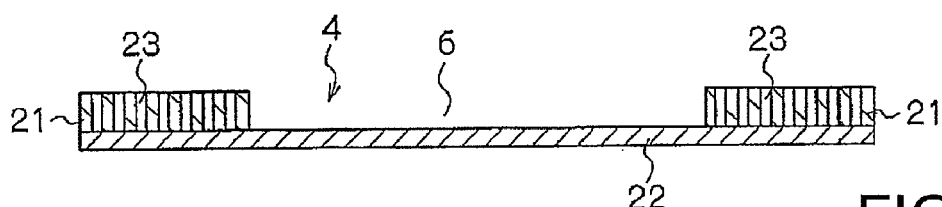
Figure 13D:
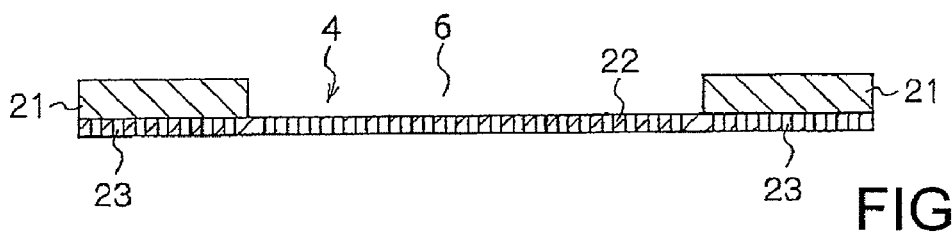
Figure 13E:
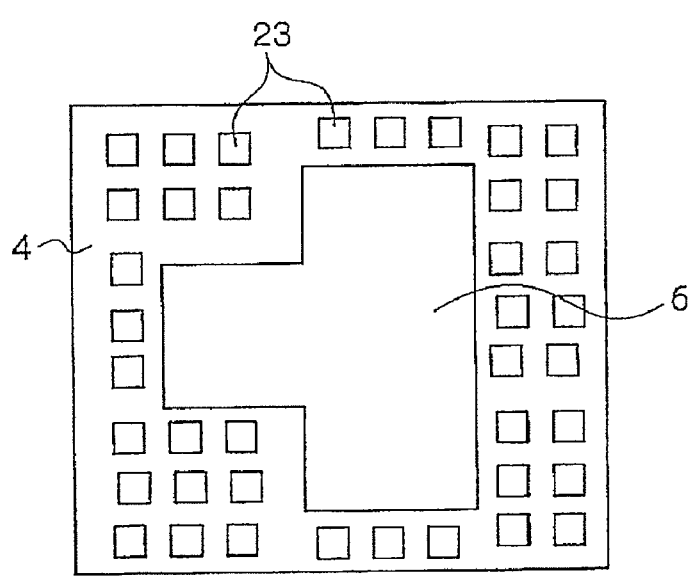

FIGS. 13A to 13E are diagrams illustrating the characteristics of the supporter 4 that is used in a fourth exemplary embodiment of this invention, and FIGS. 13A to 13D are sectional views whereas FIG. 13E is a plan view viewed from above the side of the groove 6.

The fourth exemplary embodiment of this invention differs from other exemplary embodiments only in supporter structure. In the fourth exemplary embodiment, the supporter 4 is made light-weight by providing a plurality of through holes 23 in at least one of three places: around the groove 6 of the supporter 4, around the through hole of plate 21 provided with the through hole, which is a component of the supporter 4, and in the flat plate 22 which is a component of the supporter 4. Opening a plurality of through holes 23 in a component of the supporter 4 reduces the effective volume of the component, and hence a light-weight supporter 4 may be realized.

When the supporter 4 has a large volume, the thermal capacity is large as well, which makes it difficult to form the solder bumps 8 by melting solder unless the external heating temperature is set high in a reflow step. However, setting the external heating temperature high is not preferable because it creates such problems as the detachment of a solder resist which is a component of the flexible circuit board 3 and the detachment of an interlayer adhesive within the flexible circuit board 3. In particular, when SnAg-based Pb-free solder is employed, the supporter 4 that has a large thermal capacity robs heat and prevents the solder from melting sufficiently unless the external temperature is raised to 260° C. or higher, thereby making those problems prominent. When the supporter 4 has the structure of the fourth exemplary embodiment, on the other hand, the thermal capacity of the supporter 4 may be reduced, which means that the external heating temperature may be set as low as possible in a reflow step, and the detachment of a solder resist and the detachment of an interlayer adhesive may be prevented in the flexible circuit board 3.

Fifth Exemplary Embodiment

Figure 14:
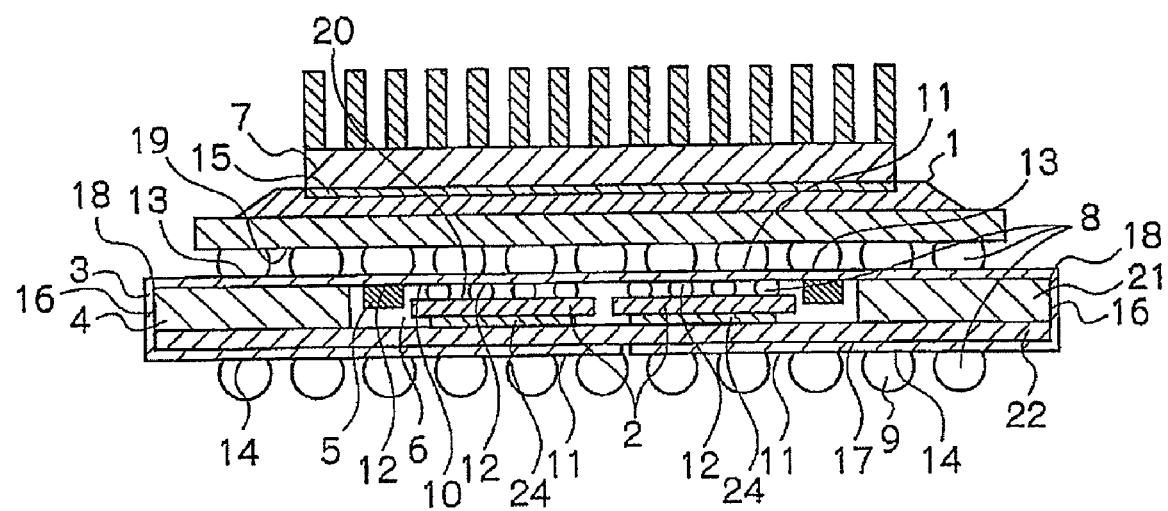
FIG. 14 is a sectional view of a semiconductor device according to a fifth exemplary embodiment of this invention.

FIG. 14 is a sectional view of a semiconductor device according to a fifth exemplary embodiment of this invention. A structural difference of the fifth exemplary embodiment of this invention from other exemplary embodiments is that the plurality of memory devices 2 and the supporter 4 are in contact with each other through a heat conducting material 24. The heat conducting material 24 is a conductive or insulative material, and uses a thermally curable material, a gel-form material, a rubber material, or the like. In FIG. 14, a face of each memory device 2 that is opposite to the external terminal face 20 of the memory device and has a large surface area is in contact with the supporter 4 via the heat conducting material 24.

With this structure, the semiconductor device may operate steadily even when the power consumption of the memory device 2 increases because heat generated by the memory device 2 is dissipated to the supporter through the heat conducting material 24 (the supporter 4 acts as a heat sink of the memory device 2).

The material of the supporter 4, particularly the material of the portion that is in contact with the memory devices 2 through the heat conducting material 24 is preferably Cu and Au which are high in heat conductivity and low in manufacture cost, or an alloy containing one of those elements as a main component. In order to make the supporter 4 light-weight, Al or an alloy containing Al as a main component is preferred.

This structure not only provides the cooling effect on the memory devices 2 themselves but also dissipates heat that is transmitted to the plurality of memory devices 2 from the computing processor device 1 into the supporter 4. The memory devices 2 are thus kept in an environment where their operation guarantee temperature is not exceeded, and hence the semiconductor device may operate steadily.

The heat conducting material 24 is preferably a gel-form material or a rubber material (products commercially available as heat dissipating gel and heat dissipating rubber, or the like). If a conductive or insulating adhesive that is a thermally curable material is used as the heat conducting material 24, and the supporter 4 and the memory devices 2 are fixed to each other, a problem arises in that stress resulting from a difference in thermal expansion coefficient between the supporter 4 and the memory devices 2 causes a crack in the heat conducting material 24, and the stress also causes a defective connection between the memory devices 2 and the flexible circuit board 3. By using a gel-form material as the heat conducting material 24 so that the supporter 4 and the memory devices 2 are simply in contact with each other instead of being fixed to each other, the stress is relieved and a highly reliable semiconductor device is realized.

Sixth Exemplary Embodiment

Figure 15A:
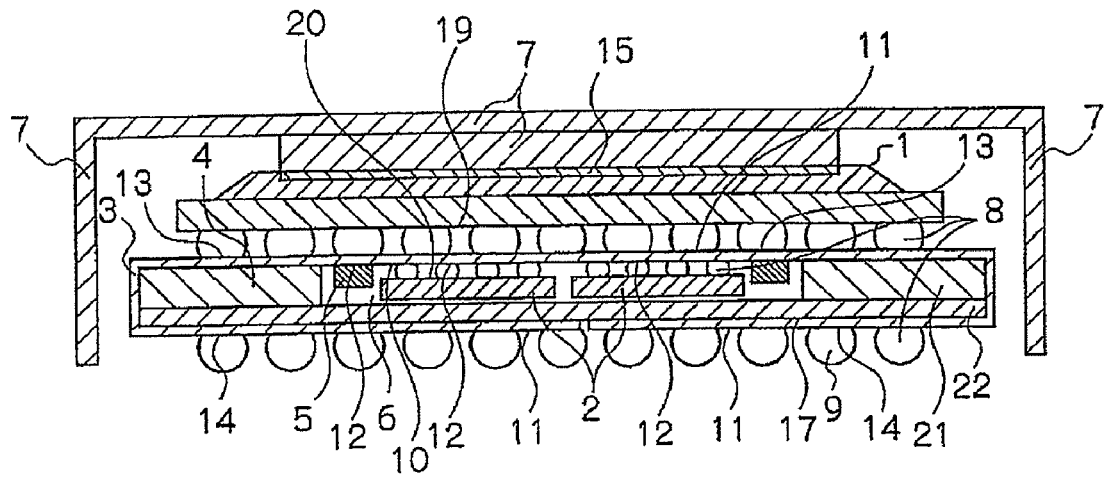
FIGS. 15A and 15B are sectional views of a semiconductor device according to a sixth exemplary embodiment of this invention.
Figure 15B:
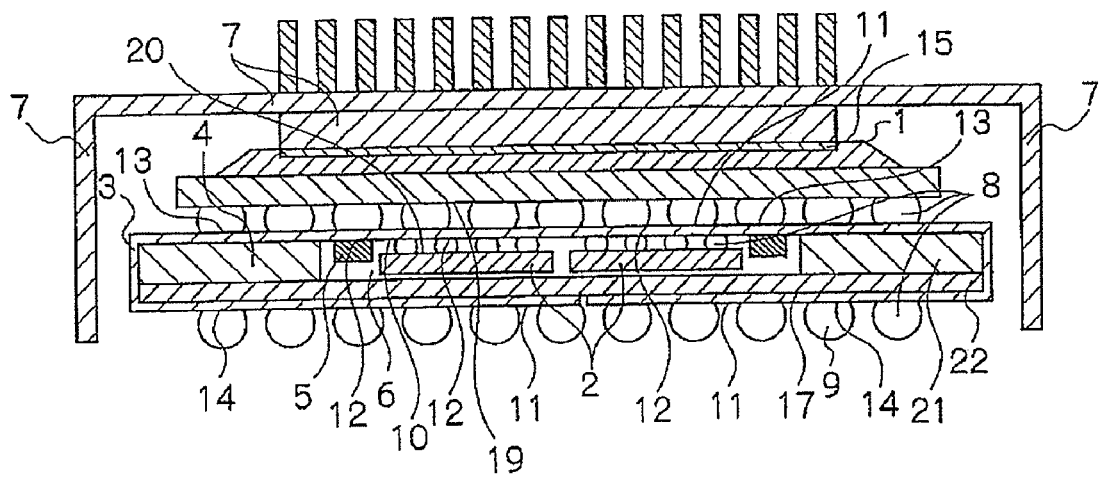

FIGS. 15A and 15B are sectional views of a semiconductor device according to a sixth exemplary embodiment of this invention. A structural difference of the sixth exemplary embodiment of this invention from other exemplary embodiments is that the heat sink 7 attached to the computing processor device 1 is shaped to cover the entire semiconductor module. The foremost advantage of shaping the heat sink 7 in this manner is that the heat sink may have a larger overall surface area and accordingly gives the obtained semiconductor device an excellent heat dissipation ability. The memory devices 2 and the passive parts 5 are visible in FIGS. 15A and 15B, which are sectional views, but are actually covered with the heat sink along the four sides of the supporter 4.

An advantage of the structure of FIG. 15A is that the packaging height of the semiconductor device, including the heat sink 7, may be kept low. When structured as in FIG. 15, the heat sink 7 has an increased volume, and hence the heat sink 7 is preferably made of Al which is high in heat conductivity and light-weight, or from an alloy containing Al as a main component.

Seventh Exemplary Embodiment

Figure 16:
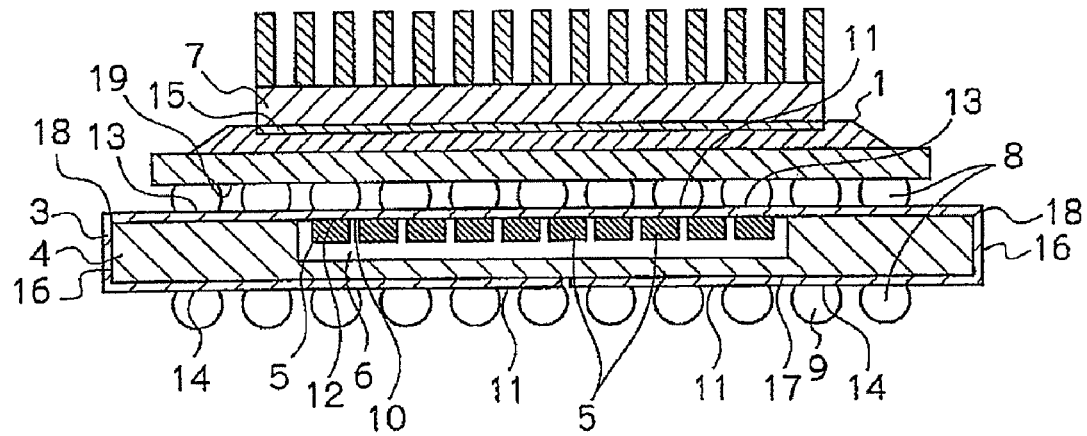
FIG. 16 is a sectional view of a semiconductor device according to a seventh exemplary embodiment of this invention.

FIG. 16 is a sectional view of a semiconductor device according to a seventh exemplary embodiment of this invention. The semiconductor device according to the seventh exemplary embodiment of this invention includes: one flexible circuit board 3 which has a first external electrode 12 on a first face 10, which has a second external electrode and a third external electrode (denoted by 13 and 14, respectively) on a second face 11, and which includes at least two wiring layers; a plurality of passive parts 5 which include at least one type out of a resistor, a capacitor, and an inductor; a supporter 4 which is provided with at least one groove 6 for housing the plurality of passive parts 5; and one computing processor device 1 which includes a heat spreader 15 or a heat sink 7.

The flexible circuit board 3 is larger in area than the supporter 4. The plurality of passive parts 5 is mounted flatly to the first face 10 of the flexible circuit board 3 and is electrically connected to the first external electrode 12 on the first face 10. The supporter 4 is adhered to the first face 10 of the flexible circuit board 3, or electrically connected to the first external terminal 12 provided on the first face 10, so as to enclose the plurality of passive parts 5. The plurality of passive parts 5 is housed inside the groove 6 of the supporter 4. The flexible circuit board 3 is bent along the perimeter of the supporter 4. The bent flexible circuit board 3 is wrapped around at least one side face 16 of the supporter 16 and at least a portion of a face 17 of the supporter 4 which is opposite to the face where the groove 6 is formed, and is adhered to at least a portion of the face of the supporter 4.

The face which is opposite to the first external electrode 12 on which the plurality of passive parts 5 is mounted includes the second external electrode 13 of the flexible circuit board 3. The computing processor device 1 is electrically connected to the second external electrode 13, and mounted such that an external terminal face 19 of the computing processor device 1 faces the plurality of passive parts 5 with the flexible circuit board 3 interposed therebetween. The face 17 of the supporter 4 which is opposite to the face where the groove 6 is formed has the third external electrode 14 of the flexible circuit board 3. Solder bumps 8 are formed on the third external electrode 14. When the solder bumps 8 are defined as a bottom face, the computing processor device 1 is mounted on the topmost face.

The seventh exemplary embodiment is similar to other exemplary embodiments but structurally differs in that a memory device 2 is not included as an electronic device.

With this structure, a plurality of components (decoupling capacitors in most cases) which has conventionally been mounted right beside the computing processor device 1, or mounted to a face opposite from the computing processor device 1 with a printed circuit board (motherboard) interposed therebetween, may be taken inside the semiconductor device. The printed circuit board is thus reduced in size. The structure also allows a decoupling capacitor to be placed in a space between the printed circuit board and the computing processor device 1 that is near a power supply terminal and a ground terminal of the computing processor device 1. This makes a parasitic inductance observed in wiring between the computing processor device 1 and the decoupling capacitor smaller than in conventional packaging modes, and reduces a voltage fluctuation generated upon switching of the computing processor device 1. The obtained semiconductor device therefore operates steadily.

While the seventh exemplary embodiment employs a structure with the heat sink 7 attached, a structure that has the heat spreader 15 alone, in other words, a structure that does not include the heat sink 7 may be employed if the environment temperature may be lowered below the operation guarantee temperature of the computing processor device 1 when the semiconductor device is in operation.

A manufacturing method according to the seventh exemplary embodiment of this invention is described next. Diagrams illustrating this manufacturing method are similar to FIGS. 10A to 10E, which illustrate the manufacturing method according to the first exemplary embodiment of this invention, and therefore omitted. FIGS. 10A to 10E minus the plurality of memory devices 2 illustrate the manufacturing method according to the seventh exemplary embodiment of this invention.

First, solder paste is applied onto the first external electrode 12 on the first face 10 of the flexible circuit board 3, the plurality of passive parts 5 are mounted temporarily to the first external electrode 12, and a reflow machine is used to connect the passive parts 5 and the flexible circuit board 3 by solder.

Next, the supporter 4 which has the groove 6 for housing the plurality of passive parts 5 is connected to the first external electrode 12 (coupled to a ground in the flexible circuit board 3) on the first face 10 of the flexible circuit board 3 with the use of solder or a conductive adhesive. The supporter 4 is mounted so as to enclose the plurality of passive parts 5. In the case where solder is employed to connect the supporter 4 and the flexible circuit board 3, a reflow machine is used, and it is preferable to perform the mounting of the passive parts 5 and the mounting of the supporter 4 at once in order to reduce thermal history. In the case where a conductive adhesive is used to adhere the supporter 4 to the flexible circuit board 3, the adhesive may be thermally cured with the use of an oven or a hot plate immediately after the adhesion, or at some point in the subsequent semiconductor device manufacturing steps, or in the last semiconductor device manufacturing step.

When the employed material requires only a short time to be cured thermally, the material is thermally cured in a scheduled reflow step and no special thermal curing process needs to be added.

Alternatively, the supporter 4 may be adhered to a surface (insulating layer) of the flexible circuit board 3 with the use of an insulative adhesive. The insulative adhesive is thermally cured in the same step as described for the case where a conductive adhesive is used.

Next, the flexible circuit board 3 is bent along the perimeter of the supporter 4 to be adhered to the side face 16 of the supporter 4 and to the face 17 of the supporter 4 which is opposite to the face where the groove is formed.

Flux or solder paste is next applied to the second external electrode 13 on the second face 11 of the flexible circuit board 3. The face where the second external electrode 13 is provided is opposite to the first external electrode 12 of the flexible circuit board 3 on which the plurality of passive parts 5 is mounted. The computing processor device 1 is then laid on top (stacked) and is connected by solder with the use of a reflow machine.

Lastly, flux is applied to the third external electrode 14 of the flexible circuit board 3 adhered on the side of the face 17 of the supporter 4 which is opposite to the face where the groove 6 is formed, and a solder ball transfer method and a reflow machine are used to form the solder bumps 8. The combination of flux application and solder ball transfer may be replaced by a print method in which solder paste is printed directly onto the third external terminal without applying flux. The seventh exemplary embodiment of this invention is thus completed.

The step of stacking the computing processor device 1 and a package in which the supporter 4 encloses the plurality of passive parts 5 and the flexible circuit board 3 is wrapped around the supporter 4 and the step of forming the solder bumps 8 on the third external electrode 14 are preferably executed simultaneously with the use of a reflow machine. In semiconductor device manufacturing steps, thermal history is reduced as much as possible in order to enhance the reliability of the semiconductor device.

With the thus structured manufacturing method, a three-dimensional packaging semiconductor device in which a computing processor device is combined with a plurality of passive parts as in this invention may readily be manufactured and the obtained three-dimensional packaging semiconductor device is high in reliability.

Eighth Exemplary Embodiment

Figure 17:
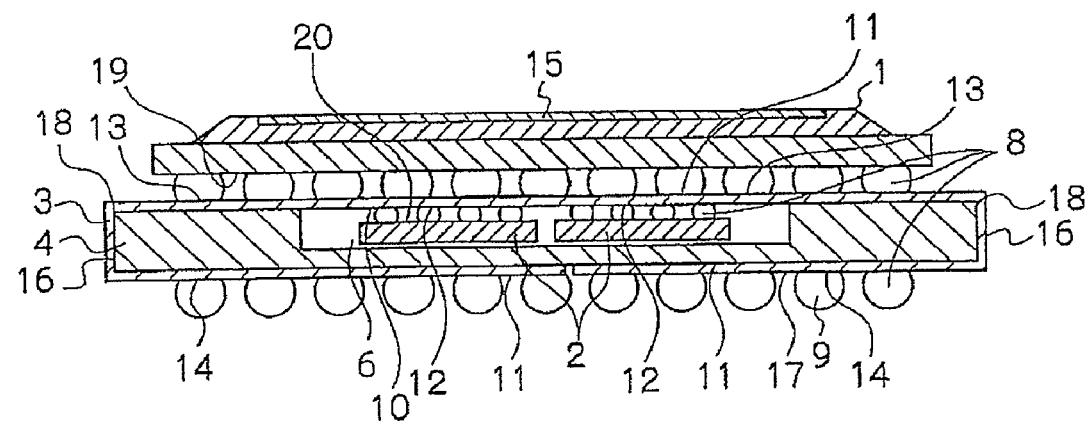
FIG. 17 is a sectional view of a semiconductor device according to an eighth exemplary embodiment of this invention.

FIG. 17 is a sectional view of a semiconductor device according to an eighth exemplary embodiment of this invention. The eighth exemplary embodiment is similar to the first exemplary embodiment of this invention that is illustrated in FIG. 1B but structurally differs from the first exemplary embodiment in that a plurality of passive parts is not mounted inside the semiconductor device.

The eighth exemplary embodiment is applied to, for example, a case where the semiconductor device is for mobile device uses and may operate on its own without containing passive parts inside because, for example, the computing processor device 1 and the plurality of memory devices 2 have an operating frequency of approximately 100 MHz or lower. The eighth exemplary embodiment is suitable for uses that require a smaller-sized semiconductor device.

The structure of this exemplary embodiment is favorable also for a case where a user desires for his/her own reasons to mount passive parts later around the semiconductor device on a motherboard. A manufacturing method of this exemplary embodiment is mostly the same as those of the other exemplary embodiments that have been described, and its description is therefore omitted.

While a device that includes the heat spreader 15 is used as the computing processor device 1 in the example of FIG. 17, a structure that includes the heat sink 7 mounted thereto or a structure that does not include the heat sink 7 nor the heat spreader 15 may be employed if the semiconductor device may be cooled below its operation guarantee temperature.

Ninth Exemplary Embodiment

FIG. 18 is a sectional view of a printed board to which a semiconductor device of this invention is mounted according to a ninth exemplary embodiment of this invention. FIG. 18 illustrates a printed circuit board to which a computing processor device 1, a plurality of memory devices 2, and a plurality of passive parts are mounted by a surface mount technology.

The semiconductor device of this invention uses three-dimensional packaging. Conventionally, the device mount area is calculated as the sum of mount areas of the respective devices. According to this invention, the device mount area required is substantially equal to the outer size of the computing processor device 1 as illustrated in FIG. 18. As a result, a printed circuit board 25 is reduced in size by the sum of the total mount area of the plurality of memory devices 2 and the total mount area of the plurality of passive devices 5, and the manufacture cost, too, is lowered that much. This invention also makes it possible to mount all devices on one side of the printed circuit board 25, whereas, in conventional surface mount, devices are mounted on both sides of the printed circuit board 25 because of the shortage of mount area and the desire to shorten the wiring distance. The number of wiring layers is thus reduced in the printed circuit board 25, with the result that manufacture cost of the printed circuit board 25 is kept low.

Tenth Exemplary Embodiment

Although a description with reference to drawings is omitted, an electronic device assembled from a semiconductor device of this invention that has been described, or from the printed circuit board of FIG. 18 to which a semiconductor device of this invention is mounted according to the ninth exemplary embodiment of this invention, is reduced in electronic device size, in printed circuit board size, and in number of wiring layers than in prior art. A low-cost electronic device is thus realized. Examples of an electronic device to which this invention is applied suitably include amusement machines, home-use game machines, medical equipment, personal computers, automotive navigation systems, and electronic modules for automobiles which are required to display high-definition images and three-dimensional motion pictures on a display.

Eleventh Exemplary Embodiment

Figure 28:
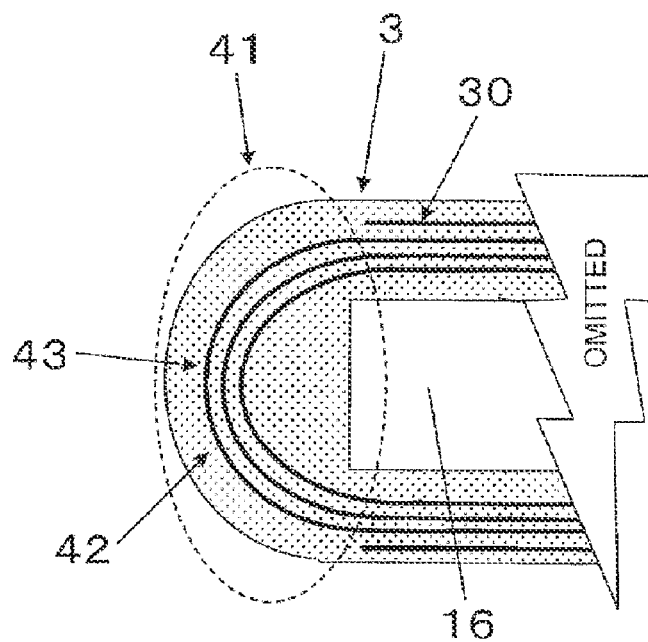
FIG. 28 is an enlarged sectional view of a bent portion of a flexible circuit board in a semiconductor device according to a tenth exemplary embodiment of this invention.

FIG. 28 is an enlarged sectional view of a bent portion of the flexible circuit board 3 in the semiconductor device according to the tenth exemplary embodiment of this invention. The flexible circuit board 3 in a semiconductor device of this invention is bent along the supporter 16 in a region 41, and the number of layers of wiring 3 is smaller in the region 41 than other regions where the flexible circuit board 3 is not bent. Generally speaking, an increase in the number of layers of the wiring 3 which means an increased wiring material (commonly a metal material) volume in the flexible circuit board 3 makes the step of bending and adhering the flexible circuit board 3 to a surface of the supporter 16 difficult (an increase in the number of wiring layers of the flexible circuit board increases a repulsive force which acts to put the bent flexible circuit board back to its original shape, and therefore makes it difficult to adhere and fix the flexible circuit board to a surface of the supporter).

According to this invention, the region 41 of the flexible circuit board 3 which is bent along the supporter 16 is smaller in the number of layers of the wiring 3 (three wiring layers in FIG. 28) than other regions of the flexible circuit board 3 which are not bent (four wiring layers in FIG. 28) as illustrated in FIG. 28. The flexible circuit board 3 is thus bent easily despite the flexible circuit board 3 being a multi-layer wiring board, and a semiconductor device that has a high assembly yield is realized.

FIG. 28 illustrates merely one example, and the number of layers of the wiring 3 in the region 41 bent along the supporter may be one or two, for example.

Which portion of the region 41 bent along the supporter is to be smaller in the number of layers of the wiring 3 than other regions is not particularly limited. However, it is preferable to remove wiring layers from an outermost portion 43, which is farthest from the supporter 16 when the flexible circuit board 3 is bent. Wiring layers located in the outermost portion 43 when the flexible circuit board 3 is bent are mechanically stretched most and are therefore liable to break. Removing wiring from the outermost portion 43 remedies the inconvenience of wire breakage.

A plurality of exemplary embodiments has now been described, but this invention is not limited to those exemplary embodiments and may be embodied in other ways without departing from the spirit of the invention.

EXAMPLES

A more detailed description of this invention is given below with reference to the drawings based on the exemplary embodiments of this invention. However, this invention is not limited to the following Examples as long as the modification is true to the spirit of the invention.

Example 1

Figure 19A:
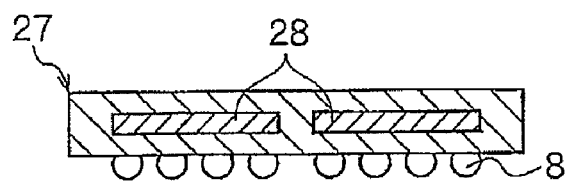
FIG. 19A is a diagram of a BGA-type DDR-DRAM package that is used in the semiconductor device according to the first example of this invention.
Figure 19B:
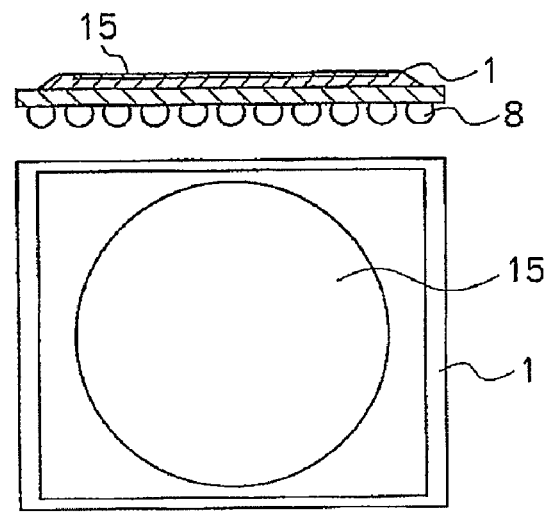
FIG. 19B is a diagram of a BGA-type three-dimensional image processing processor package that is used in the semiconductor device according to the first example of this invention.
Figure 19C:
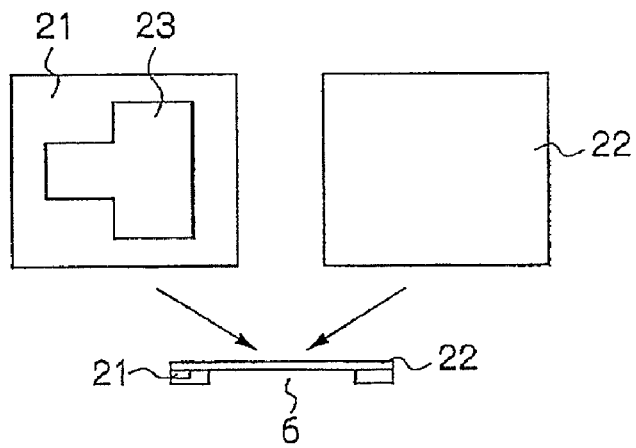
FIG. 19C is a diagram of the supporter used in the semiconductor device according to the first example of this invention.
Figure 19D:
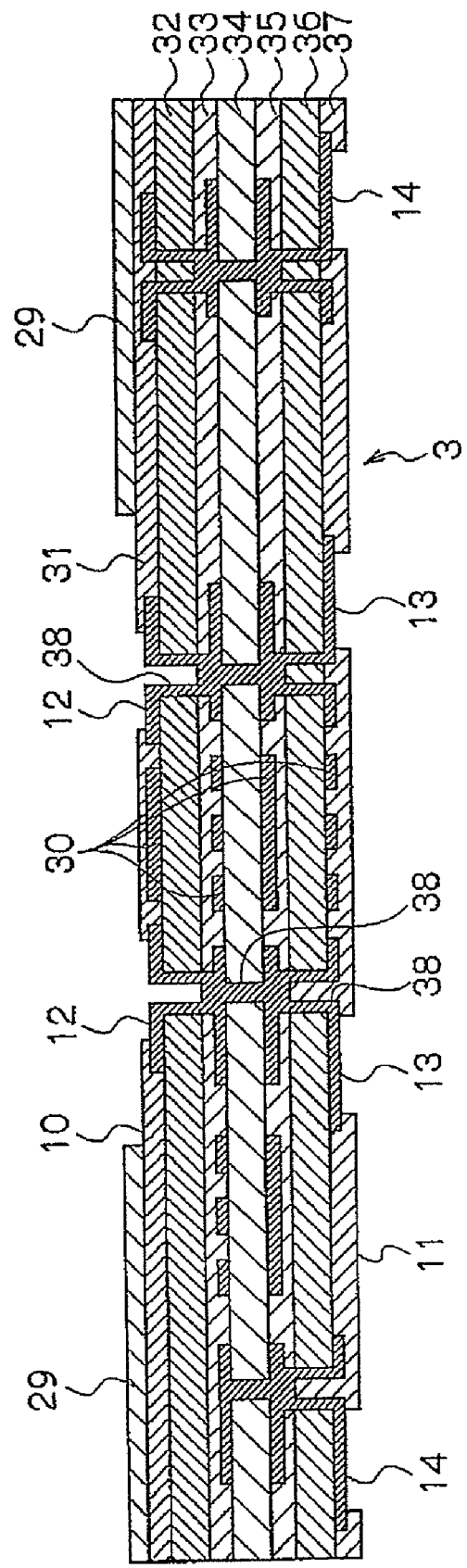
FIG. 19D is a sectional view of the flexible circuit board used in the semiconductor device according to the first embodiment of this invention.

Components prepared to manufacture a semiconductor device of this invention were: four BGA-type DDR-DRAM packages illustrated in FIG. 19A (outer size: approximately 13 mm×13 mm×0.7 mm (height), memory capacity: 256 Mbit, external clock frequency: 166 MHz, external terminal count: approximately a hundred and seventy pins, solder ball pitch: 0.8 mm); one BGA-type three-dimensional image processing processor package illustrated in FIG. 19B (approximately 38 mm×38 mm×2.0 mm (height), external clock frequency: 166 MHz, external terminal count: approximately eight hundred pins, solder ball pitch: 1.27 mm); sixteen 1005-type chip capacitors (1.0 mm×0.5 mm) (100 pF to 100 nF); four 1005-type chip resistors (33Ω, 1.0 mm×0.5 mm); one supporter illustrated in FIG. 19C and made of Al (44 mm×44 mm×1.3 mm (thickness)); one flexible circuit board illustrated in FIG. 19D and having four wiring layers (outer size: approximately 44 mm×91 mm×0.14 mm (thickness)); and approximately eight hundred SgAgCu solder balls having a diameter of approximately 0.8 mm and used as external terminals of the semiconductor device of this invention.

In the DDR-DRAM packages employed here, two DDR-DRAM bare chips 28 are flatly mounted side by side within each package as illustrated in FIG. 19A. The specifications of the employed DDR-DRAM packages are such that data terminals (terminals commonly marked as "DQ") of the bare chips 28 in each DDR-DRAM package are electrically connected to external terminals (which are the solder bumps (balls) 8 in FIG. 19A) of the DDR-DRAM package independently of each other. Connecting the data terminals of the two DDR-DRAM bare chips independently of each other in this manner (the number of external terminals is increased that much), instead of connecting the data terminals to a shared terminal, widens the data bus width and a higher signal transmission rate is thus accomplished. As illustrated in FIG. 19D, a thermoplastic adhesive sheet with a thickness of 25 μm was attached as the adhesive layer 29 in advance to a portion of the first face 10 of the flexible circuit board 3 that is to be adhered to a surface of the supporter 4. A material that starts exhibiting adhesion at 150° C. or higher was used for the thermoplastic sheet. The supporter was made by partially connecting an Al plate which has a through hole and an Al flat plate by spot welding.

First, solder cream (solder paste) was applied onto an external electrode on the first face of the flexible circuit board, and the DDR-DRAM packages and the chip capacitors plus the chip resistors were mounted temporarily to the flexible circuit board 3 with the use of a flip chip mounter and a chip mounter, respectively. After that, a reflow machine was used to connect those devices to the flexible circuit board by solder.

Next, a conductive adhesive was used to adhere the supporter to the external electrode (external electrode connected to the ground) on the first face of the flexible circuit board so as to enclose the DDR-DRAM packages, the chip capacitors, and the chip resistors. The supporter was adhered to the flexible circuit board with the use of a mounter.

Figure 19E:
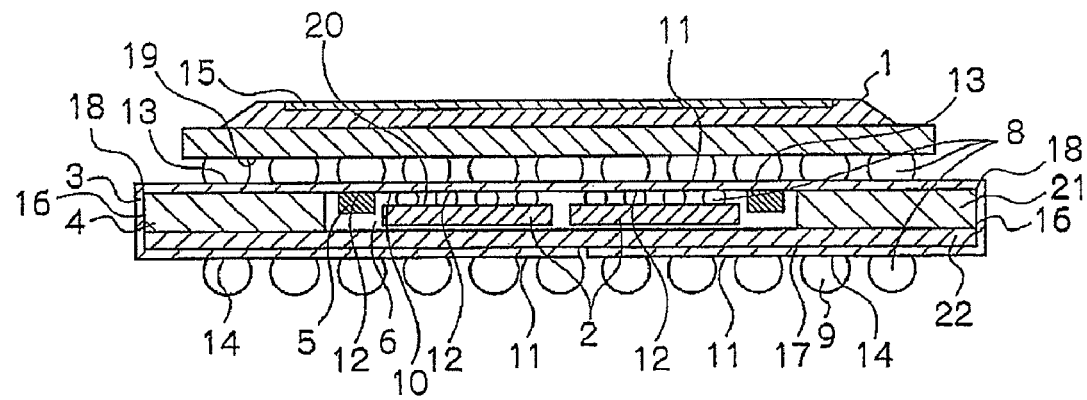
FIG. 19E is a sectional view of the semiconductor device according to the first example of this invention.

The sample was next fixed by adsorption on a heater stage heated to 180° C., the flexible circuit board was bent along two sides of the supporter with the use of a pressing tool to be adhered to a surface of the supporter, and the plurality of DDR-DRAM packages and the plurality of capacitors and resistors were enclosed by the supporter to create a package in which the flexible circuit board is wrapped around and adhered to the supporter. Of the faces of the thus created package, a computing processor package was laid on top of a package face that is on the side of external terminal faces of the DDR-DRAM packages, and solder balls to serve as external terminals of the semiconductor device were mounted temporarily with flux to a package face that is opposite from the external terminals of the DDR-DRAM packages. The sample was then put in a reflow furnace for solder connection, and a semiconductor device of FIG. 19E was thus completed.

The outside dimensions of the thus created semiconductor package were approximately 44 mm×44 mm×4 mm (height). Despite the large outer size, the semiconductor package was easy to assemble and, when mounted to a motherboard of a personal computer (PC), the semiconductor package was confirmed to call up an image similar to that of a normal product.

This Example also successfully reduced the motherboard of the personal computer in size. Though omitted from FIG. 19E, after the semiconductor device of Example 1 was mounted to the motherboard of the personal computer, a heat sink is adhered on top of the heat spreader 15 with the use of a conductive adhesive.

Example 2

Figure 19F:
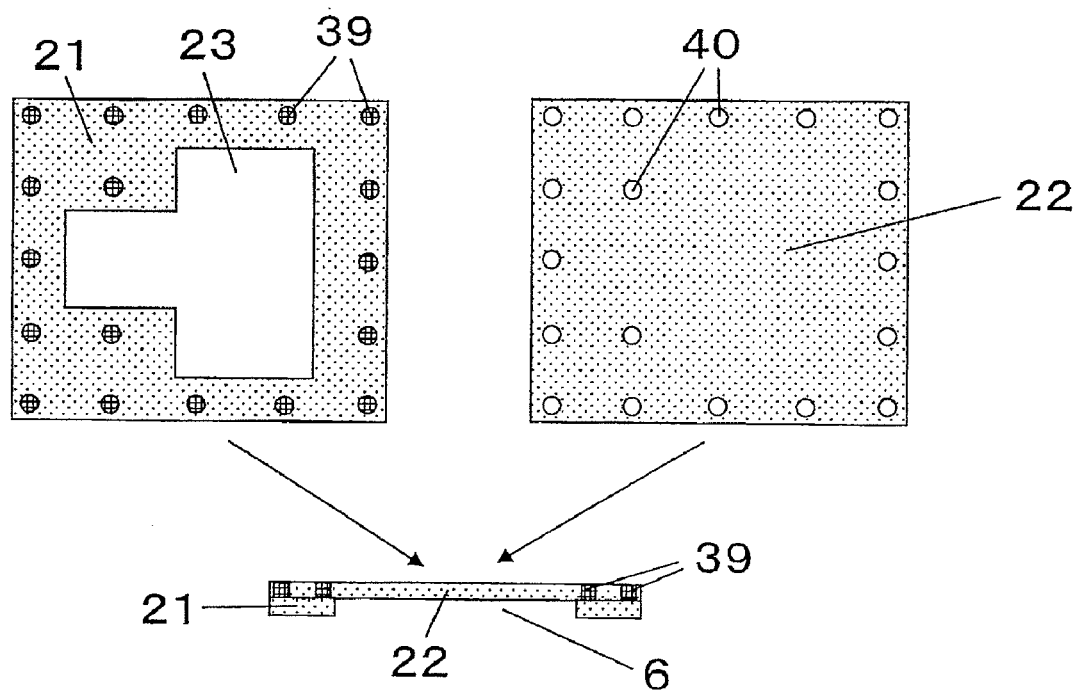
FIG. 19F is a diagram illustrating a supporter that is used in the semiconductor device according to a second example embodiment of this invention.
Figure 20:
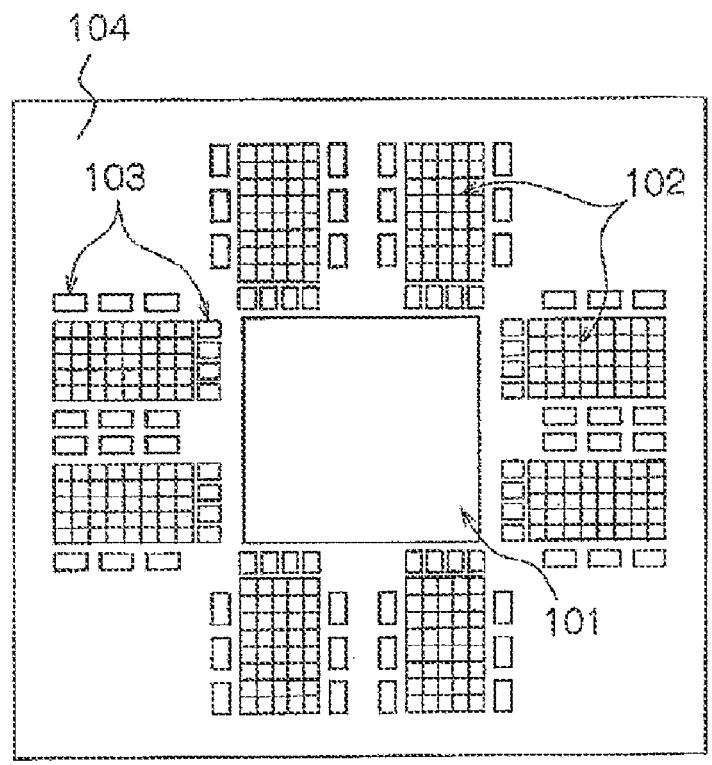
FIG. 20 is a diagram of a related semiconductor device I, which is a printed circuit board manufactured by mounting semiconductor parts with the use of a related packaging technology (surface mount technology).
Figure 21:
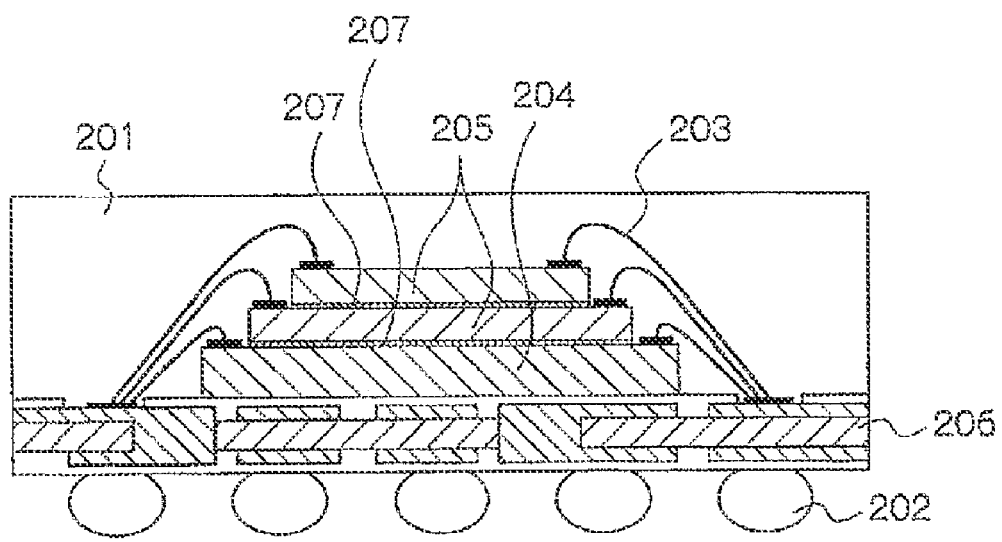
FIG. 21 is a sectional view of a related semiconductor device II.
Figure 22:
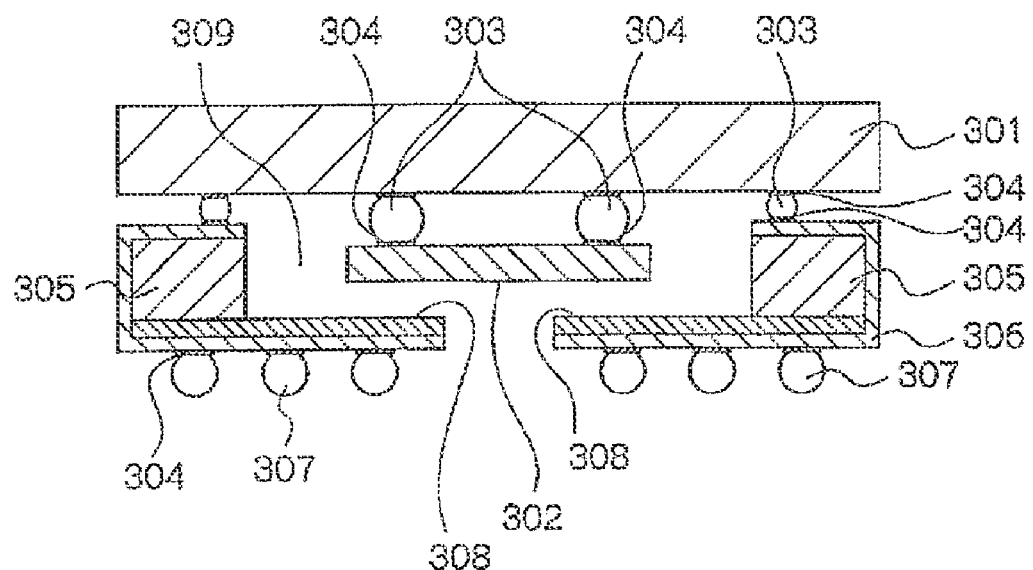
FIG. 22 is a sectional view of a semiconductor device III, which is described in Japanese Unexamined Patent Application Publication (JP-A) No. 2006-190834 (Patent Document 1).
Figure 23:
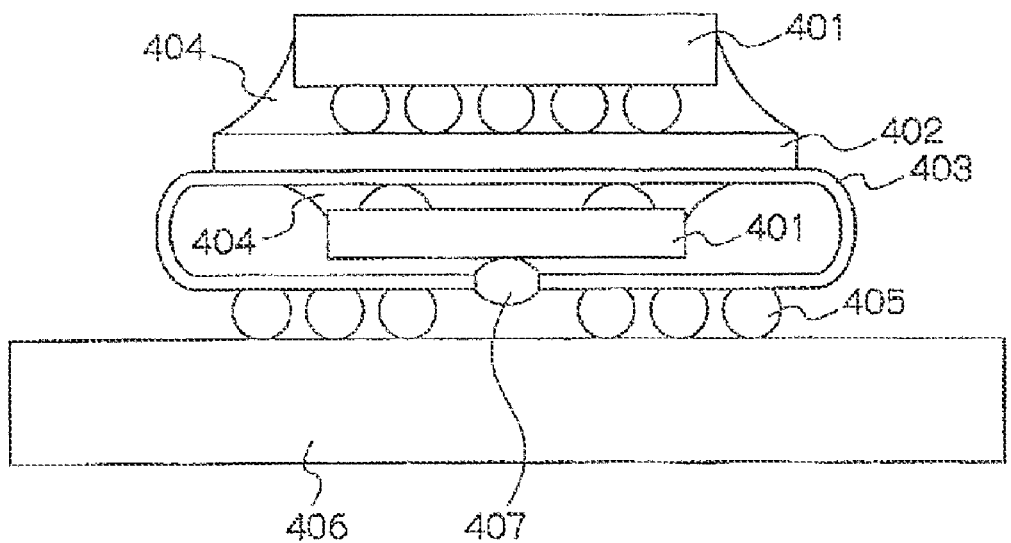
FIG. 23 is a sectional view of a semiconductor device IV, which is described in Japanese Unexamined Patent Application Publication (JP-A) No. 2007-188921 (Patent Document 2).
Figure 24:
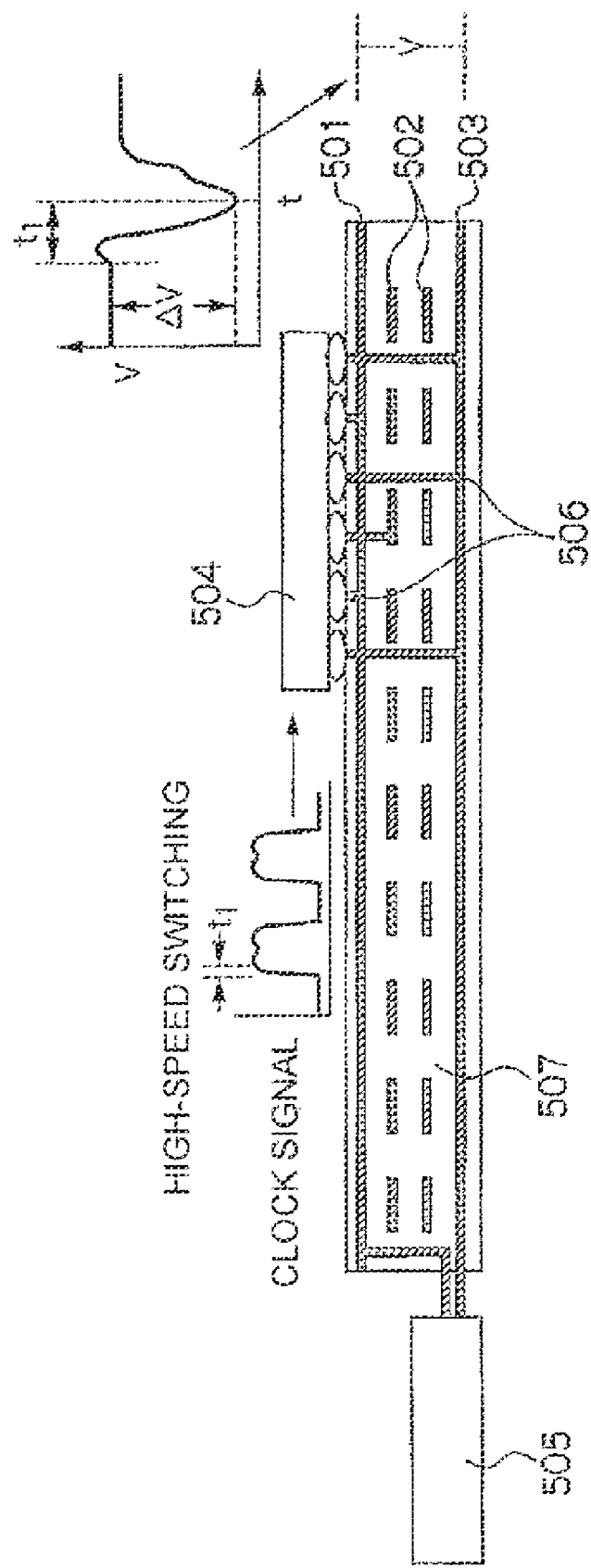
FIG. 24 is a diagram illustrating a fluctuation (ΔV) in DC voltage (V) supplied to a computing processor device that performs high-speed switching at a rise time of t1 and is mounted to a printed circuit board.
Figure 25:
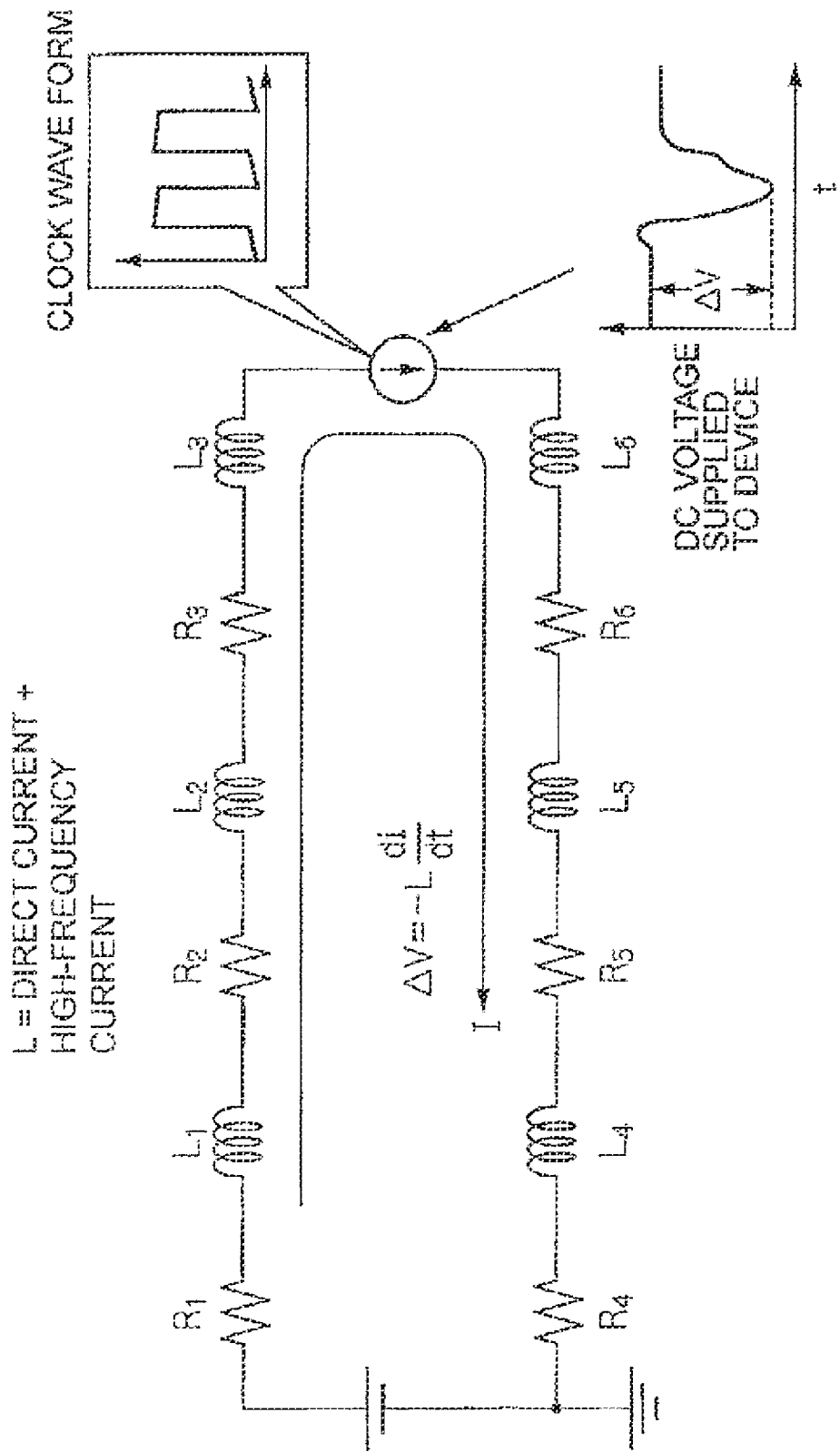
FIG. 25 is a diagram illustrating an equivalent circuit of FIG. 24.
Figure 26:
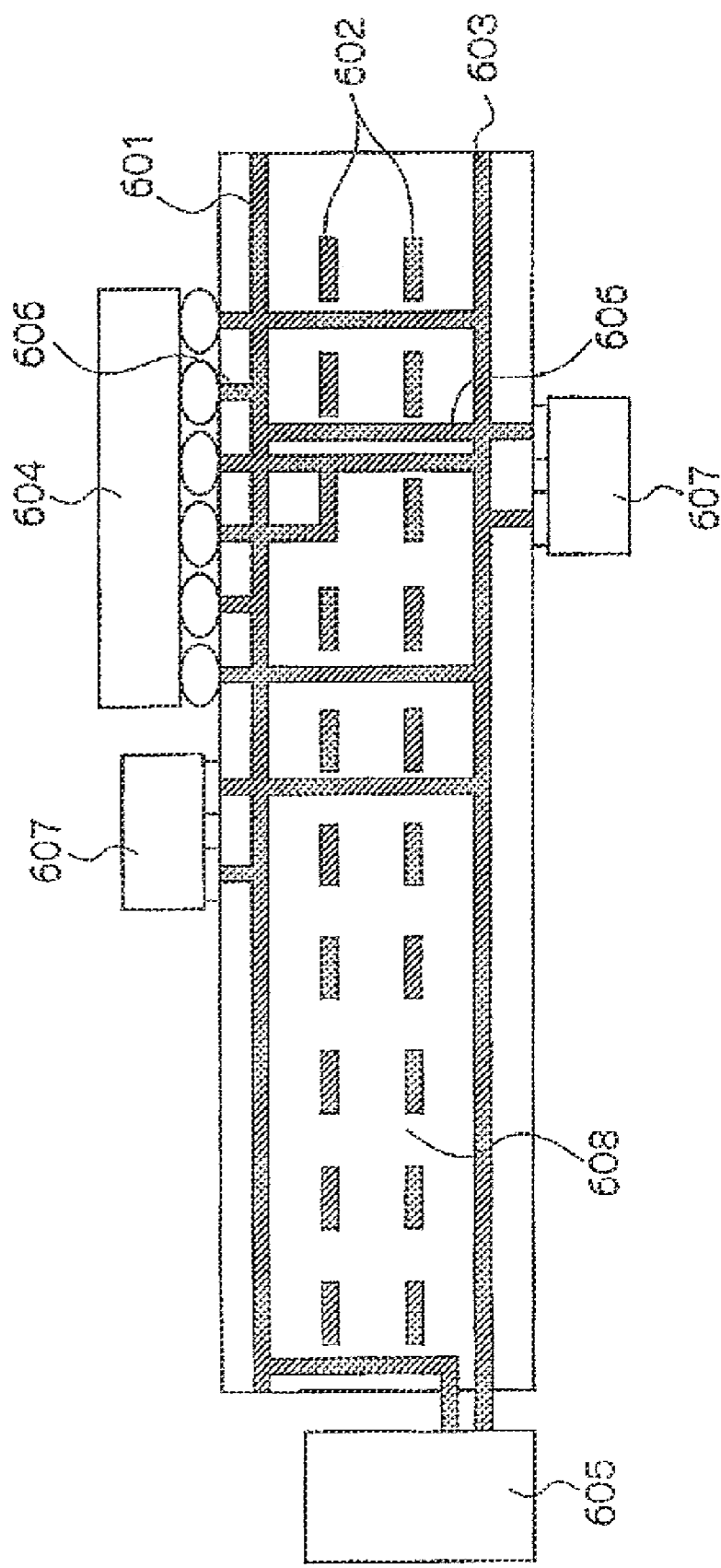
FIG. 26 is a diagram in which a computing processor device is mounted to a printed circuit board and decoupling capacitors are connected between a power supply line and a ground line of the computing processor device.
Figure 27:
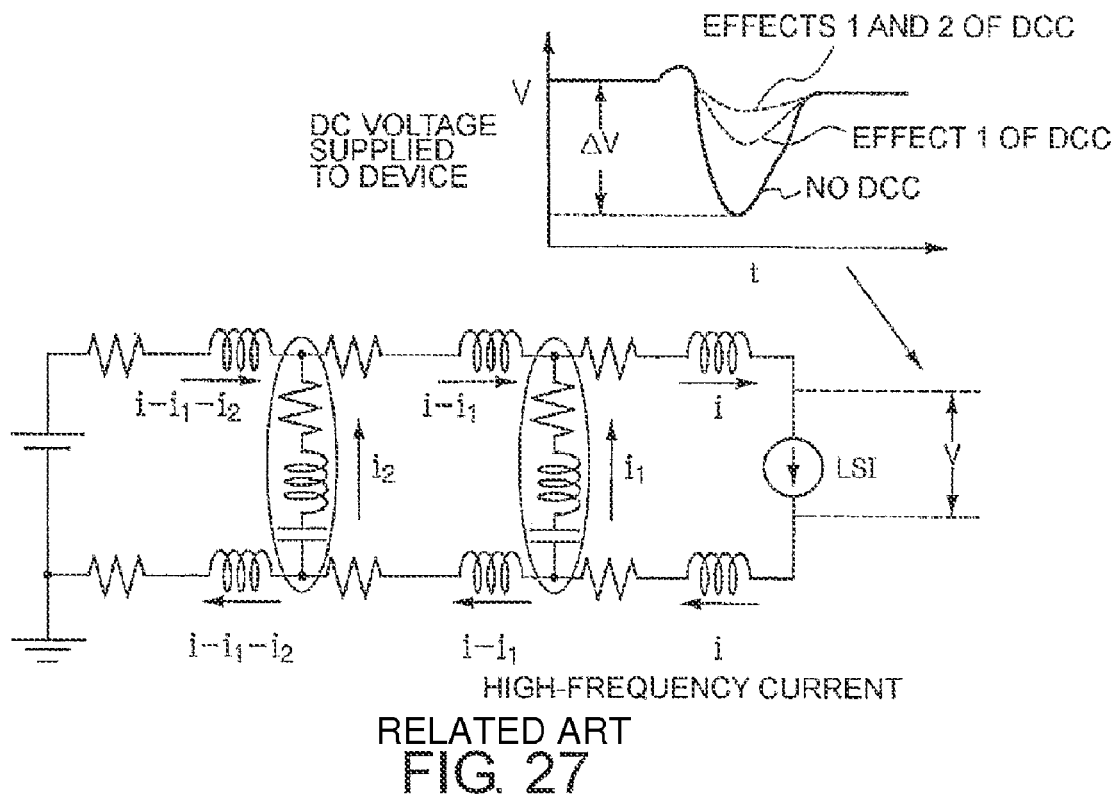
FIG. 27 is a diagram illustrating an equivalent circuit of FIG. 26.

In order to manufacture a semiconductor device of this invention, a supporter was made from an Al plate 21, which has a plurality of Al projections on one face and has a through hole, and from a flat plate, which has a plurality of through holes, by connecting the projections and the through holes as illustrated in FIG. 19F. Except for this supporter, the same materials and manufacture method as those in Example 1 were used to manufacture a semiconductor device.

The thus created semiconductor package was as easy to assemble as in Example 1 and, when mounted to a motherboard of a personal computer (PC), was confirmed to call up an image similar to that of a normal product.

The supporter created by the method described above may be manufactured lower in cost than the supporter used in Example 1. Therefore, a semiconductor device lower in cost than the semiconductor device of Example 1 was realized.

Examples of this invention have now been described, but this invention is not limited to those Examples and many more modifications may be made without departing from the spirit of the invention.

While the invention has been particularly shown and described with reference to the exemplary embodiment and the examples thereof, the invention is not limited to the embodiment and the examples. It will be understood by those of ordinary skill in the art that various changes in form and details may be made therein without departing from the spirit and scope of this invention as defined by the claims.

This application is based upon and claims the benefit of priority from Japanese patent application No. 2008-087138, filed on Mar. 28, 2008, the disclosure of which is incorporated herein by its entirety by reference.

The invention claimed is:

1. A semiconductor device comprising:
   a plate-shaped supporter which includes at least one groove having a groove bottom surface;
   a flexible circuit board which covers a first face of the plate-shaped supporter where the at least one groove is provided, an aperture plane of the at least one groove, and at least a portion of a back face of the plate-shaped supporter,
   wherein the back face of the supporter is disposed opposite of the first face of the plate-shaped supporter where the at least one groove is provided;

at least one first electronic part mounted to a first face of the flexible circuit board that is opposed to the groove bottom surface of the at least one groove of the plate-shaped supporter;

at least one second electronic part mounted to a second face of the flexible circuit board that is opposite to the first face of the flexible circuit board that is opposed to the groove bottom surface of the at least one groove of the plate-shaped supporter; and a solder bump mounted to a portion of the flexible circuit board that covers the back face of the plate-shaped supporter.

2. A semiconductor device according to claim 1, wherein the at least one second electronic part is larger in power consumption than the at least one first electronic part.

3. A semiconductor device according to claim 1, wherein the at least one second electronic part is larger in mount area than the at least one first electronic part.

4. A semiconductor device according to claim 1, wherein the at least one second electronic part comprises a computing processor device.

5. A semiconductor device according to claim 4, wherein the computing processor device comprises an image processing processor device.

6. A semiconductor device according to claim 1, wherein the at least one first electronic device includes at least one of: a memory device; and a passive part that includes at least one type out of resistor, capacitor, and inductor.

7. A semiconductor device according to claim 1, wherein at least one of the at least one first electronic part comprises a DRAM.

8. A semiconductor device according to claim 1, wherein the at least one first electronic part includes a plurality of memory devices, and at least one of the plurality of memory devices has a multi-chip package structure or a package-on-package structure in which packages are stacked on top of one another.

9. A semiconductor device according to claim 1, wherein the at least one second electronic part comprises at least one of a heat spreader and a heat sink.

10. A semiconductor device according to claim 1, further comprising a heat sink attached to the at least one second electronic part, the heat sink being shaped to cover the entire semiconductor device.

11. A semiconductor device according to claim 1, wherein at least one of the at least one first electronic part and the at least one second electronic part is a BGA-type package.

12. A semiconductor device according to claim 1, wherein the plate-shaped supporter is made of a metal material and electrically connected to a ground of the flexible circuit board.

13. A semiconductor device according to claim 1, wherein the plate-shaped supporter is at least partially made of a material selected from the group consisting of an alloy containing Ni such as alloy 42 or Kovar, ceramics, and Si.

14. A semiconductor device according to claim 1, wherein the plate-shaped supporter is created from at least one plate including at least one through hole that houses the at least one first electronic part and from one flat plate by stacking the at least one plate and the flat plate.

15. A semiconductor device according to claim 14, wherein at least a portion of the at least one plate of the plate-shaped supporter where the at least one through hole is opened is made of an alloy containing Ni such as alloy 42 or Kovar.

16. A semiconductor device according to claim 14, wherein, of components of the plate-shaped supporter, at least the one flat plate is made of a material selected from the group consisting of aluminum, an aluminum alloy, titanium, a titanium alloy, ceramics, and Si.

17. A semiconductor device according to claim 14, wherein stacked components of the plate-shaped supporter are, at least partially, adhered to or connected to each other through a conductive material or an insulative material, or at least partially welded to each other.

18. A semiconductor device according to claim 14, wherein a surface of one of stacked components of the plate-shaped supporter includes a projection formed thereon, another component which is stacked together with the one component includes a through hole or a groove formed therein to receive the projection, and the stacked components are connected to each other at the projection and the through hole or the groove.

19. A semiconductor device according to claim 1, wherein one or more through holes are opened around the groove of the plate-shaped supporter.

20. A semiconductor device according to claim 14, wherein the supporter includes one or more through holes formed in at least one of around the at least one through hole of the at least one plate which is a component of the plate-shaped supporter, and within the one flat plate which is another component of the plate-shaped supporter.

21. A semiconductor device according to claim 1, wherein the at least one first electronic part and the plate-shaped supporter are in contact with each other through a heat conducting material.

22. A semiconductor device according to claim 1, further comprising a thermoplastic adhesive resin film or an uncured thermally curable adhesive resin film attached to a portion of the first face of the flexible circuit board where the at least one first electronic part is mounted, to be adhered to a surface of the plate-shaped supporter.

23. A semiconductor device according to claim 1, wherein a region of the flexible circuit board that is bent along the plate-shaped supporter is smaller in number of wiring layers than in other regions which are not bent.

24. A printed circuit board to which the semiconductor device according to claim 1 is mounted.

25. An electronic device to which the printed circuit board according to claim 24 is mounted.

26. An electronic device to which the semiconductor device according to claim 1 is mounted.

* * * * *